(12) United States Patent
Huang

(10) Patent No.: US 12,237,318 B2
(45) Date of Patent: Feb. 25, 2025

(54) METHOD FOR FABRICATING SEMICONDUCTOR DEVICE WITH REDISTRIBUTION STRUCTURE

(71) Applicant: NANYA TECHNOLOGY CORPORATION, New Taipei (TW)

(72) Inventor: Tse-Yao Huang, Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 18/378,892

(22) Filed: Oct. 11, 2023

(65) Prior Publication Data
US 2024/0047447 A1 Feb. 8, 2024

Related U.S. Application Data

(63) Continuation of application No. 17/510,878, filed on Oct. 26, 2021, now Pat. No. 11,830,865.

(51) Int. Cl.
*H01L 23/00* (2006.01)
*H01L 21/768* (2006.01)
(Continued)

(52) U.S. Cl.
CPC ........ *H01L 25/18* (2013.01); *H01L 21/76841* (2013.01); *H01L 23/53223* (2013.01);
(Continued)

(58) Field of Classification Search
None
See application file for complete search history.

(56) References Cited

U.S. PATENT DOCUMENTS

| 7,642,173 B2 * | 1/2010 | McDonald | H01L 23/481 438/455 |
| 8,344,514 B2 * | 1/2013 | Cobbley | H01L 24/13 257/773 |

(Continued)

FOREIGN PATENT DOCUMENTS

| CN | 108962873 A | * | 12/2018 | ....... H01L 21/76807 |
| CN | 208674107 U | * | 3/2019 | ....... H01L 21/76807 |

(Continued)

OTHER PUBLICATIONS

Office Action mailed on Oct. 6, 2023 related to Taiwanese Application No. 111102231.
(Continued)

*Primary Examiner* — Telly D Green
(74) *Attorney, Agent, or Firm* — Xuan Zhang

(57) ABSTRACT

The present application discloses a semiconductor device and a method for fabricating the semiconductor device. The semiconductor device includes a first chip including: a first inter-dielectric layer positioned on a first substrate; a plug structure positioned in the first inter-dielectric layer and electrically coupled to a functional unit of the first chip; a first redistribution layer positioned on the first inter-dielectric layer and distant from the plug structure; a first lower bonding pad positioned on the first redistribution layer; and a second lower bonding pad positioned on the plug structure; and a second chip positioned on the first chip and including: a first upper bonding pad positioned on the first lower bonding pad; a second upper bonding pad positioned on the second lower bonding pad; and a plurality of storage units electrically coupled to the first upper bonding pad and the second upper bonding pad.

16 Claims, 22 Drawing Sheets

(51) Int. Cl.
    *H01L 23/532* (2006.01)
    *H01L 25/00* (2006.01)
    *H01L 25/18* (2023.01)

(52) U.S. Cl.
    CPC .. *H01L 23/53238* (2013.01); *H01L 23/53266* (2013.01); *H01L 24/08* (2013.01); *H01L 24/80* (2013.01); *H01L 25/50* (2013.01); *H01L 2224/02372* (2013.01); *H01L 2224/02373* (2013.01); *H01L 2224/08145* (2013.01); *H01L 2224/80895* (2013.01); *H01L 2224/80896* (2013.01)

(56) References Cited

U.S. PATENT DOCUMENTS

| | | | |
|---|---|---|---|
| 9,449,837 B2* | 9/2016 | Yu | H01L 23/522 |
| 9,553,020 B2* | 1/2017 | Tsai | H01L 27/1469 |
| 9,754,918 B2* | 9/2017 | Yu | H01L 24/19 |
| 11,088,020 B2* | 8/2021 | Yang | H01L 21/76811 |
| 11,315,903 B2* | 4/2022 | Huang | H01L 24/08 |
| 11,538,747 B2* | 12/2022 | Ding | H01L 23/5223 |
| 11,596,800 B2* | 3/2023 | Tsai | A61N 1/3987 |
| 11,830,865 B2 | 11/2023 | Huang | |
| 2006/0038300 A1* | 2/2006 | Tanida | H01L 24/16 |
| | | | 257/E21.705 |
| 2006/0073695 A1* | 4/2006 | Filippi | H01L 21/76807 |
| | | | 438/622 |
| 2006/0146233 A1* | 7/2006 | Park | H01L 27/1464 |
| | | | 349/95 |
| 2008/0157394 A1* | 7/2008 | Kwon | H01L 23/3121 |
| | | | 257/E23.141 |
| 2008/0284041 A1* | 11/2008 | Jang | H01L 21/76898 |
| | | | 257/774 |
| 2011/0057321 A1* | 3/2011 | Wang | H01L 24/80 |
| | | | 257/E21.597 |
| 2011/0171582 A1* | 7/2011 | Farooq | H01L 21/76898 |
| | | | 430/314 |
| 2011/0221070 A1* | 9/2011 | Yen | H01L 24/06 |
| | | | 257/E21.578 |
| 2013/0264688 A1* | 10/2013 | Qian | H01L 27/14634 |
| | | | 257/E29.022 |
| 2014/0264947 A1* | 9/2014 | Lin | H01L 24/80 |
| | | | 438/455 |
| 2014/0327140 A1* | 11/2014 | Zhang | H01L 21/28562 |
| | | | 438/653 |
| 2016/0093601 A1* | 3/2016 | Ding | H01L 23/544 |
| | | | 257/777 |
| 2016/0379963 A1* | 12/2016 | Tsai | H01L 21/76877 |
| | | | 257/774 |
| 2017/0062392 A1* | 3/2017 | Cheng | H01L 23/5386 |
| 2019/0096800 A1* | 3/2019 | Wei | H01L 28/91 |
| 2020/0013715 A1* | 1/2020 | Park | H01L 21/76829 |
| 2020/0027783 A1* | 1/2020 | Kim | H01L 21/76877 |
| 2021/0118794 A1* | 4/2021 | Ding | H01L 28/60 |
| 2022/0037248 A1* | 2/2022 | Choi | H01L 21/4857 |
| 2023/0025094 A1* | 1/2023 | Huang | H01L 25/0657 |

FOREIGN PATENT DOCUMENTS

| | | | | |
|---|---|---|---|---|
| CN | 113078119 A | * | 7/2021 | H01L 21/78 |
| CN | 115910992 A | * | 4/2023 | H01L 21/4853 |
| KR | 20160010274 A | * | 1/2016 | |
| TW | 201813009 A | | 4/2018 | |
| TW | 202036690 A | | 10/2020 | |
| TW | 202046444 A | | 12/2020 | |

OTHER PUBLICATIONS

Office Action and search report mailed on Aug. 22, 2024 related to U.S. Appl. No. 18/381,297.

* cited by examiner

METHOD FOR FABRICATING SEMICONDUCTOR DEVICE WITH REDISTRIBUTION STRUCTURE

CROSS-REFERENCE TO RELATED APPLICATION

This application is a continuation application of U.S. Non-Provisional application Ser. No. 17/510,878 filed Oct. 26, 2021, which is incorporated herein by reference in its entirety.

TECHNICAL FIELD

The present disclosure relates to a semiconductor device and a method for fabricating the semiconductor device, and more particularly, to a semiconductor device with a redistribution structure and a method for fabricating the semiconductor device with the redistribution structure.

DISCUSSION OF THE BACKGROUND

Semiconductor devices are used in a variety of electronic applications, such as personal computers, cellular telephones, digital cameras, and other electronic equipment. The dimensions of semiconductor devices are continuously being scaled down to meet the increasing demand of computing ability. However, a variety of issues arise during the scaling-down process, and such issues are continuously increasing. Therefore, challenges remain in achieving improved quality, yield, performance, and reliability and reduced complexity.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor device including a first chip including: a first inter-dielectric layer positioned on a first substrate; a plug structure positioned in the first inter-dielectric layer and electrically coupled to a functional unit of the first chip; a first redistribution layer positioned on the first inter-dielectric layer and distant from the plug structure; a first lower bonding pad positioned on the first redistribution layer; and a second lower bonding pad positioned on the plug structure; and a second chip positioned on the first chip and including: a first upper bonding pad positioned on the first lower bonding pad; a second upper bonding pad positioned on the second lower bonding pad; and a plurality of storage units electrically coupled to the first upper bonding pad and the second upper bonding pad.

In some embodiments, the first chip is configured as a logic chip and the second chip is configured as a memory chip.

In some embodiments, the plug structure includes a bottom plug positioned on the first substrate, a landing pad positioned on the bottom plug, and a top plug positioned between the landing pad and the second lower bonding pad.

In some embodiments, the semiconductor device includes a first barrier layer positioned between the top plug and the second lower bonding pad.

In some embodiments, the semiconductor device includes a second barrier layer positioned between the landing pad and the top plug.

In some embodiments, the semiconductor device includes a third barrier layer positioned between the top plug and the second lower bonding pad, and a fourth barrier layer positioned between the first lower bonding pad and the first redistribution layer.

In some embodiments, a bottom surface of the third barrier layer is at a vertical level lower than a top surface of the first redistribution layer.

In some embodiments, a width of the first chip and a width of the second chip are substantially the same.

In some embodiments, the bottom plug includes aluminum, copper, or a combination thereof, and the top plug includes tungsten.

In some embodiments, the third barrier layer includes titanium and titanium nitride.

In some embodiments, the plurality of storage units are configured as a capacitor array or a floating array.

Another aspect of the present disclosure provides a semiconductor device including a first chip including: a first substrate including a center region and a peripheral region surrounding the center region; a first center bonding pad positioned above the center region of the first substrate; and a first peripheral bonding pad positioned above the peripheral region of the first substrate; and a second chip positioned on the first chip and including: a plurality of peripheral upper bonding pads located at a peripheral region of the second chip and respectively positioned on the first center bonding pad and the first peripheral bonding pad; a plurality of redistribution structures respectively positioned on the plurality of peripheral upper bonding pads and extending toward a center region of the second chip; a plurality of center lower bonding pads located at the center region of the second chip and respectively positioned on the plurality of redistribution structures; and a plurality of storage units electrically coupled to the plurality of center lower bonding pads.

In some embodiments, the plurality of redistribution structures include: a plurality of redistribution layers respectively positioned on the plurality of peripheral upper bonding pads, and respectively extending from the peripheral region of the second chip toward the center region of the second chip; and a plurality of redistribution plugs located at the center region of the second chip, and positioned between the plurality of center lower bonding pads and the plurality of redistribution layers, respectively and correspondingly.

In some embodiments, the semiconductor device includes a plurality of first supporting plugs respectively positioned on the plurality of redistribution layers, wherein the plurality of first supporting plugs are distant from the plurality of redistribution plugs and the plurality of first supporting plugs are floating.

In some embodiments, the semiconductor device includes a plurality of second supporting plugs respectively positioned on the plurality of redistribution layers, wherein the plurality of second supporting plugs are distant from the plurality of first supporting plugs and the plurality of second supporting plugs are floating.

In some embodiments, a distance between an adjacent pair of the plurality of redistribution plugs and the plurality of first supporting plugs and a distance between an adjacent pair of the plurality of first supporting plugs and the plurality of second supporting plugs are substantially the same.

In some embodiments, the semiconductor device includes a molding layer positioned on the first chip and covering the second chip.

Another aspect of the present disclosure provides a method for fabricating a semiconductor device including providing a first substrate including a functional unit; forming a plug structure on the first substrate and electrically coupled to the functional unit; forming a first redistribution layer above the first substrate; forming a first lower bonding pad on the first redistribution layer; forming a second lower bonding pad on the plug structure, wherein the first substrate, the plug structure, the first redistribution layer, the first lower bonding pad, and the second lower bonding pad together configure a first chip; and bonding a second chip onto the first chip. The second chip includes a first upper bonding pad bonded on the first lower bonding pad, a second upper bonding pad bonded on the second lower bonding pad, and a plurality of storage units electrically coupled to the first upper bonding pad and the second upper bonding pad.

In some embodiments, the first chip is configured as a logic chip and the second chip is configured as a memory chip, and the plurality of storage units are configured as a capacitor array or a floating array.

In some embodiments, the plug structure includes a bottom plug formed on the first substrate, a landing pad formed on the bottom plug, and a top plug formed on the landing pad.

Due to the design of the semiconductor device of the present disclosure, data signal may be transmitted through the first upper bonding pad, the first lower bonding pad, and the first redistribution layer without passing through the conductive features, the plug structure, and functional units of the first chip. As a result, the distance of transmittance may be reduced so that the performance of the semiconductor device may be improved. In addition, the power consumption of the semiconductor device may be reduced due to the shorter distance of transmittance The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
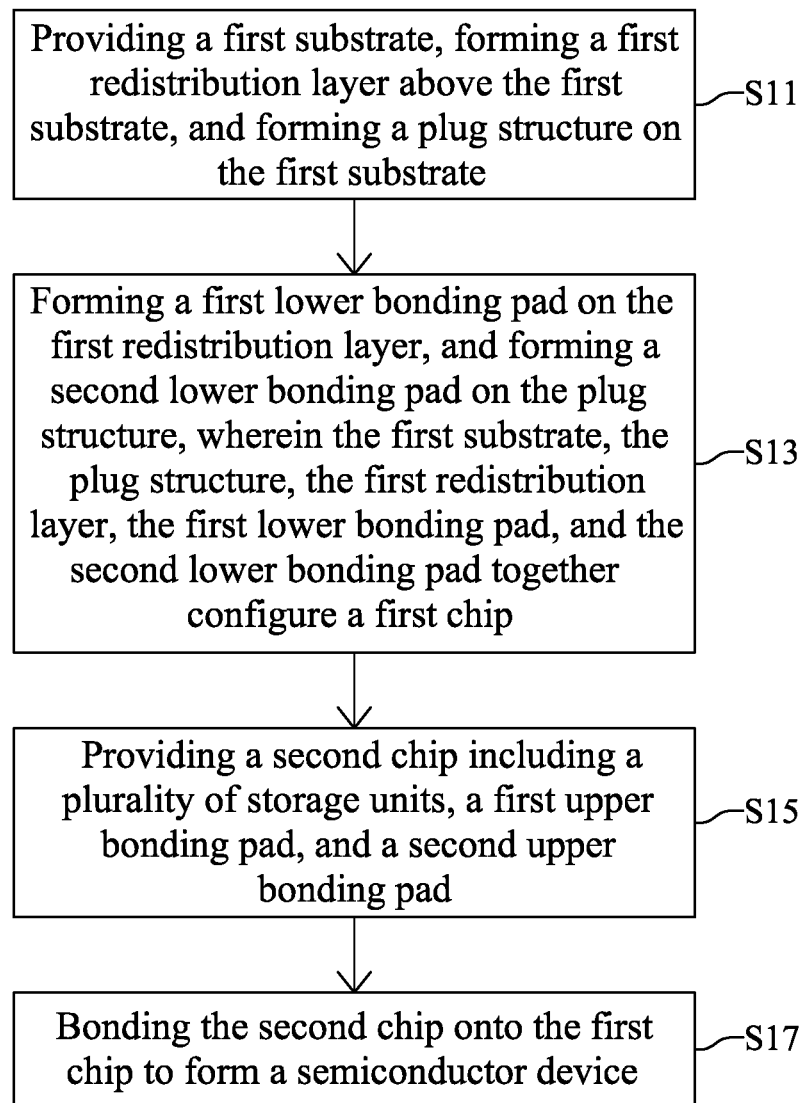
FIG. 1 illustrates, in a flowchart diagram form, a method for fabricating a semiconductor device in accordance with one embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It should be understood that when an element or layer is referred to as being "connected to" or "coupled to" another element or layer, it can be directly connected to or coupled to another element or layer, or intervening elements or layers may be present.

It should be understood that, although the terms first, second, etc. may be used herein to describe various elements, these elements should not be limited by these terms. Unless indicated otherwise, these terms are only used to distinguish one element from another element. Thus, for example, a first element, a first component or a first section discussed below could be termed a second element, a second component or a second section without departing from the teachings of the present disclosure.

Unless the context indicates otherwise, terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning. For example, items described as "substantially the same," "substantially equal," or "substantially planar," may be exactly the same, equal, or planar, or may be the same, equal, or planar within acceptable variations that may occur, for example, due to manufacturing processes.

In the present disclosure, a semiconductor device generally means a device which can function by utilizing semiconductor characteristics, and an electro-optic device, a light-emitting display device, a semiconductor circuit, and an electronic device are all included in the category of the semiconductor device.

It should be noted that, in the description of the present disclosure, above (or up) corresponds to the direction of the arrow of the direction Z, and below (or down) corresponds to the opposite direction of the arrow of the direction Z.

It should be noted that, in the description of the present disclosure, the terms "forming," "formed" and "form" may mean and include any method of creating, building, patterning, implanting, or depositing an element, a dopant, or a material. Examples of forming methods may include, but are not limited to, atomic layer deposition, chemical vapor deposition, physical vapor deposition, sputtering, co-sputtering, spin coating, diffusing, depositing, growing, implantation, photolithography, dry etching, and wet etching.

It should be noted that, in the description of the present disclosure, the functions or steps noted herein may occur in an order different from the order noted in the figures. For example, two figures shown in succession may in fact be executed substantially concurrently or may sometimes be executed in a reversed order, depending upon the functionalities or steps involved.

FIG. 1 illustrates, in a flowchart diagram form, a method 10 for fabricating a semiconductor device 1A in accordance with one embodiment of the present disclosure. FIGS. 2 to 8 illustrate, in schematic cross-sectional view diagrams, a flow for fabricating the semiconductor device 1A in accordance with one embodiment of the present disclosure.

With reference to FIGS. 1 to 4, at step S11, a first substrate 111 may be provided, a first redistribution layer 131 may be formed above the first substrate 111, and a plug structure 121 may be formed on the first substrate 111.

Figure 2:
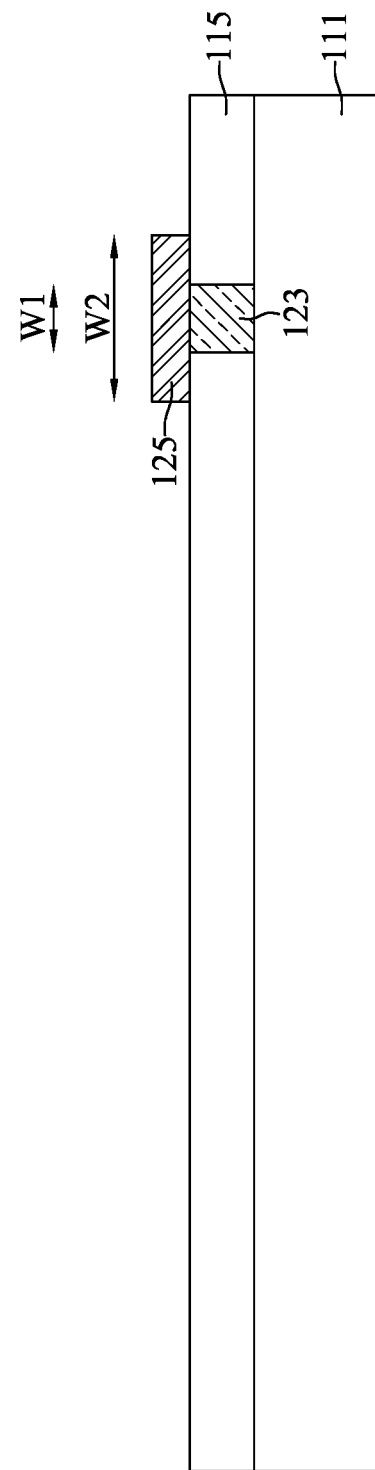
FIGS. 2 to 8 illustrate, in schematic cross-sectional view diagrams, a flow for fabricating the semiconductor device in accordance with one embodiment of the present disclosure.

With reference to FIG. 2, in some embodiments, the first substrate 111 may include a bulk semiconductor substrate that is composed entirely of at least one semiconductor material, a plurality of device elements (not shown for clarity), a plurality of dielectric layers (not shown for clarity), and a plurality of conductive features (not shown for clarity). The bulk semiconductor substrate may be formed of, for example, an elementary semiconductor, such as silicon or germanium; a compound semiconductor, such as silicon germanium, silicon carbide, gallium arsenide, gallium phosphide, indium phosphide, indium arsenide, indium antimonide, or other III-V compound semiconductor or II-VI compound semiconductor; or combinations thereof.

In some embodiments, the first substrate 111 may further include a semiconductor-on-insulator structure which consisting of, from bottom to top, a handle substrate, an insulator layer, and a topmost semiconductor material layer. The handle substrate and the topmost semiconductor material layer may be formed of a same material as the bulk semiconductor substrate aforementioned. The insulator layer may be a crystalline or non-crystalline dielectric material such as an oxide and/or nitride. For example, the insulator layer may be a dielectric oxide such as silicon oxide. For another example, the insulator layer may be a dielectric nitride such as silicon nitride or boron nitride. For yet another example, the insulator layer may include a stack of a dielectric oxide and a dielectric nitride such as a stack of, in any order, silicon oxide and silicon nitride or boron nitride. The insulator layer may have a thickness between about 10 nm and 200 nm.

It should be noted that, in the description of present disclosure, the term "about" modifying the quantity of an ingredient, component, or reactant of the present disclosure employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

The plurality of device elements may be formed on the first substrate 111. Some portions of the plurality of device elements 111 may be formed in the first substrate 111. The plurality of device elements may be transistors such as complementary metal-oxide-semiconductor transistors, metal-oxide-semiconductor field-effect transistors, fin field-effect-transistors, the like, or a combination thereof.

The plurality of dielectric layers may be formed on the first substrate 111 and covering the plurality of device elements. In some embodiments, the plurality of dielectric layers may be formed of, for example, silicon oxide, borophosphosilicate glass, undoped silicate glass, fluorinated silicate glass, low-k dielectric materials, the like, or a combination thereof. The low-k dielectric materials may have a dielectric constant less than 3.0 or even less than 2.5. In some embodiments, the low-k dielectric materials may have a dielectric constant less than 2.0. The plurality of dielectric layers may be formed by deposition processes such as chemical vapor deposition, plasma-enhanced chemical vapor deposition, or the like. Planarization processes may be performed after the deposition processes to remove excess material and provide a substantially flat surface for subsequent processing steps.

The plurality of conductive features may include interconnect layers, conductive vias, and conductive pads. The interconnect layers may be separated from each other and may be horizontally disposed in the plurality of dielectric layers along the direction Z. In the present embodiment, the topmost interconnect layers may be designated as the conductive pads. The conductive vias may connect adjacent interconnect layers along the direction Z, adjacent device element and interconnect layer, and adjacent conductive pad and interconnect layer. In some embodiments, the conductive vias may improve heat dissipation and may provide structure support. In some embodiments, the plurality of conductive features may be formed of, for example, tungsten, cobalt, zirconium, tantalum, titanium, aluminum, ruthenium, copper, metal carbides (e.g., tantalum carbide, titanium carbide, tantalum magnesium carbide), metal nitrides (e.g., titanium nitride), transition metal aluminides, or a combination thereof. The plurality of conductive features may be formed during the formation of the plurality of dielectric layers.

The plurality of device elements, and the plurality of conductive features may together configure functional units. A functional unit, in the description of the present disclosure, generally refers to functionally related circuitry that has been partitioned for functional purposes into a distinct unit. In some embodiments, functional units may be typically highly complex circuits such as processor cores or accelerator units. In some other embodiments, the complexity and functionality of a functional unit may be more or less complex.

With reference to FIG. 2, a bottom dielectric layer 115 may be formed on the first substrate 111. In some embodiments, the bottom dielectric layer 115 may be formed of, for example, silicon oxide, borophosphosilicate glass, undoped silicate glass, fluorinated silicate glass, low-k dielectric materials, the like, or a combination thereof. The bottom dielectric layer 115 may be formed by deposition processes such as chemical vapor deposition, plasma-enhanced chemical vapor deposition, or the like. Planarization processes may be performed after the deposition processes to remove excess material and provide a substantially flat surface for subsequent processing steps.

With reference to FIG. 2, a bottom plug 123 may be formed along the bottom dielectric layer 115 and electrically coupled to the corresponding one of device element in the first substrate 111. In other words, the bottom plug 123 may be in conjunction with the functional units in the first substrate 111. In some embodiments, the bottom plug 123 may be formed of, for example, tungsten, cobalt, zirconium, tantalum, titanium, aluminum, ruthenium, copper, metal carbides (e.g., tantalum carbide, titanium carbide, tantalum magnesium carbide), metal nitrides (e.g., titanium nitride), transition metal aluminides, or a combination thereof. In the present embodiments, the bottom plug 123 may be formed of an alloy of aluminum and copper.

With reference to FIG. 2, a landing pad 125 may be formed on the bottom plug 123. The width W1 of the landing pad 125 may be greater than the width W2 of the bottom plug 123. In some embodiments, the landing pad 125 may be formed of, for example, tungsten, cobalt, zirconium, tantalum, titanium, aluminum, ruthenium, copper, metal carbides (e.g., tantalum carbide, titanium carbide, tantalum magnesium carbide), metal nitrides (e.g., titanium nitride), transition metal aluminides, or a combination thereof. In some embodiments, the landing pad 125 may be formed by performing a blanket deposition process with following patterning and etching processes.

Figure 3:
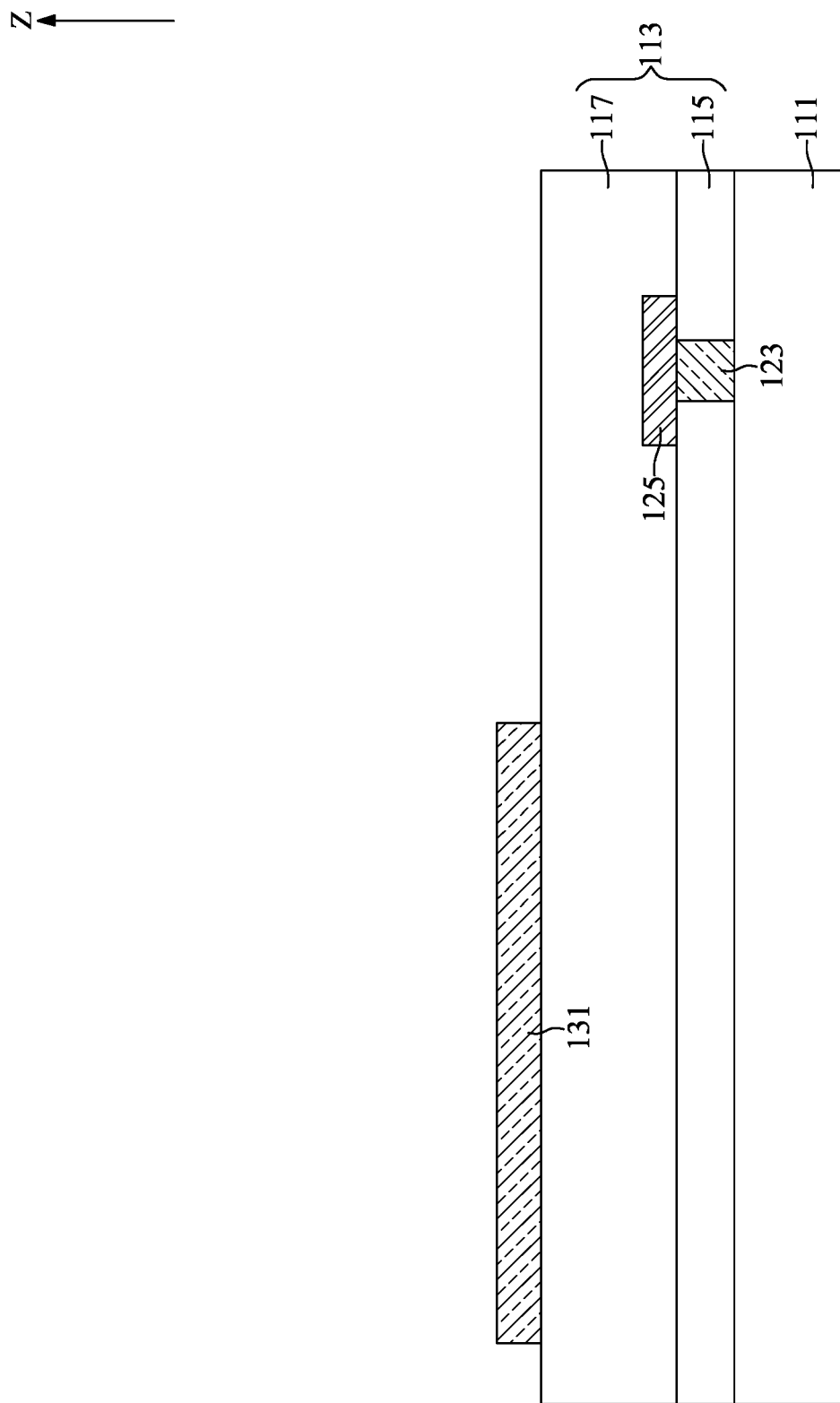

With reference to FIG. 3, a top dielectric layer 117 may be formed on the bottom dielectric layer 115 and covering the landing pad 125. The top dielectric layer 117 may be formed of the same material as the bottom dielectric layer 115, and descriptions thereof are not repeated herein. The top dielectric layer 117 may be formed by a deposition process such as chemical vapor deposition, plasma-enhanced chemical vapor deposition, or the like. A planarization process may be performed after the deposition process to remove excess material and provide a substantially flat surface for subsequent processing steps. The bottom dielectric layer 115 and the top dielectric layer 117 may together configure a first inter-dielectric layer 113.

With reference to FIG. 3, the first redistribution layer 131 may be formed on the first inter-dielectric layer 113. In some embodiments, the first redistribution layer 131 may be formed of, for example, tungsten, cobalt, zirconium, tantalum, titanium, aluminum, ruthenium, copper, metal carbides (e.g., tantalum carbide, titanium carbide, tantalum magnesium carbide), metal nitrides (e.g., titanium nitride), transition metal aluminides, or a combination thereof. In some embodiments, the first redistribution layer 131 may be formed by performing a blanket deposition process with following patterning and etching processes. It should be noted that the first redistribution layer 131 does not electrically couple to any functional units in the first substrate 111.

Figure 4:
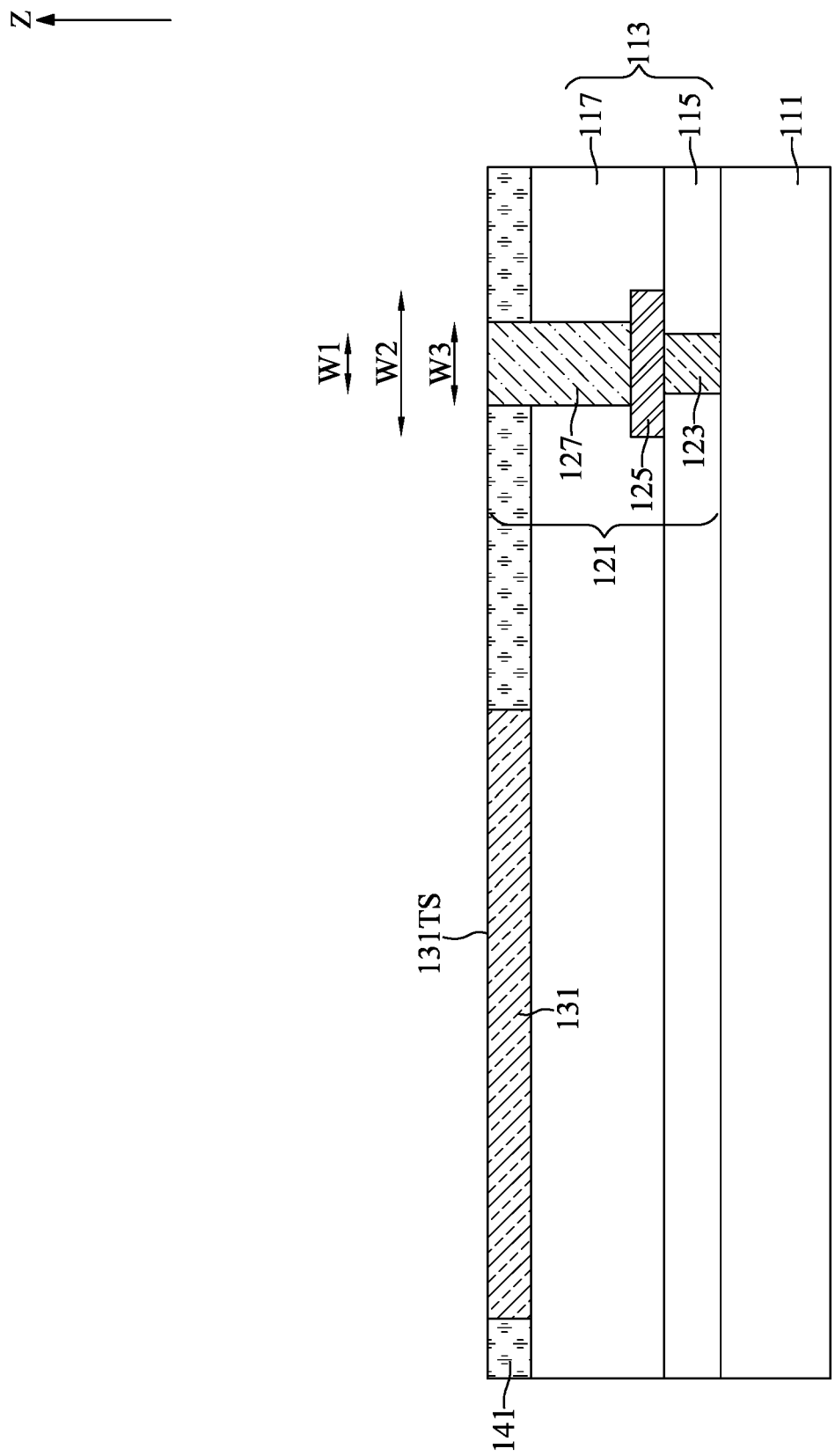

With reference to FIG. 4, a first bottom passivation layer 141 may be formed on the first inter-dielectric layer 113 and covering the first bottom passivation layer 141. In some embodiments, the first bottom passivation layer 141 may be formed of, for example, silicon oxide, silicon nitride, silicon oxynitride, silicon nitride oxide, silicon carbon nitride, the like, or a combination thereof. In some embodiments, the bottom passivation layer 141 may be formed of, for example, a polymer layer including polyimide, polybenzoxazole, benzocyclobuten, epoxy, silicone, acrylates, nano-filled phenoresin, siloxane, a fluorinated polymer, polynorbornene, or the like. A planarization process may be performed until the top surface 131TS of the first redistribution layer 131 is exposed to remove excess material and provide a substantially flat surface for subsequent processing steps.

It should be noted that, in the description of the present disclosure, a surface of an element (or a feature) located at the highest vertical level along the direction Z is referred to as a top surface of the element (or the feature). A surface of an element (or a feature) located at the lowest vertical level along the direction Z is referred to as a bottom surface of the element (or the feature).

With reference to FIG. 4, a top plug 127 may be formed along the first bottom passivation layer 141, extending to the top dielectric layer 117, and on the landing pad 125. The width W3 of the top plug 127 may be greater than the width W1 of the bottom plug 123. The width W3 of the top plug 127 may be less than the width W2 of the landing pad 125. In some embodiments, the top plug 127 may be formed of, for example, tungsten, cobalt, zirconium, tantalum, titanium, aluminum, ruthenium, copper, metal carbides (e.g., tantalum carbide, titanium carbide, tantalum magnesium carbide), metal nitrides (e.g., titanium nitride), transition metal aluminides, or a combination thereof. A patterning process with a mask layer (not shown for clarity), which masks the first redistribution layer 131, may be performed to form a plug opening (not shown for clarity) to expose a portion of the landing pad 125. A subsequent deposition process may be performed to deposit the aforementioned material to fill the plug opening. A planarization process may be performed until the top surface 131TS of the first redistribution layer 131 is exposed to remove excess material and concurrently form the top plug 127. In the present embodiment, the top plug 127 may include tungsten.

The bottom plug 123, the landing pad 125, and the top plug 127 may together configure the plug structure 121. The plug structure 121 may electrically couple to the corresponding one of device element in the first substrate 111. In other words, the plug structure 121 may be in conjunction with the functional units in the first substrate 111.

Figure 5:
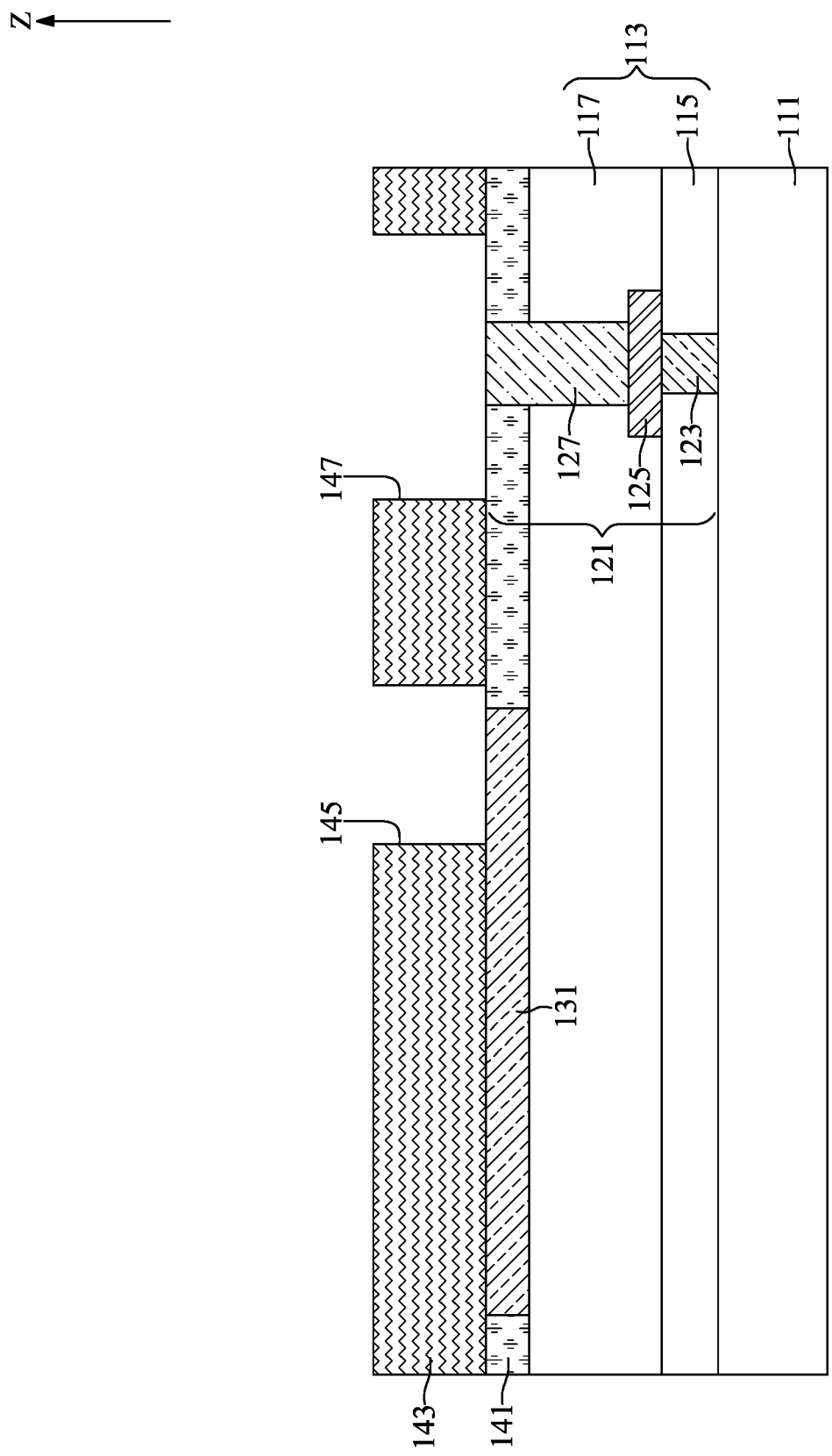
Figure 6:
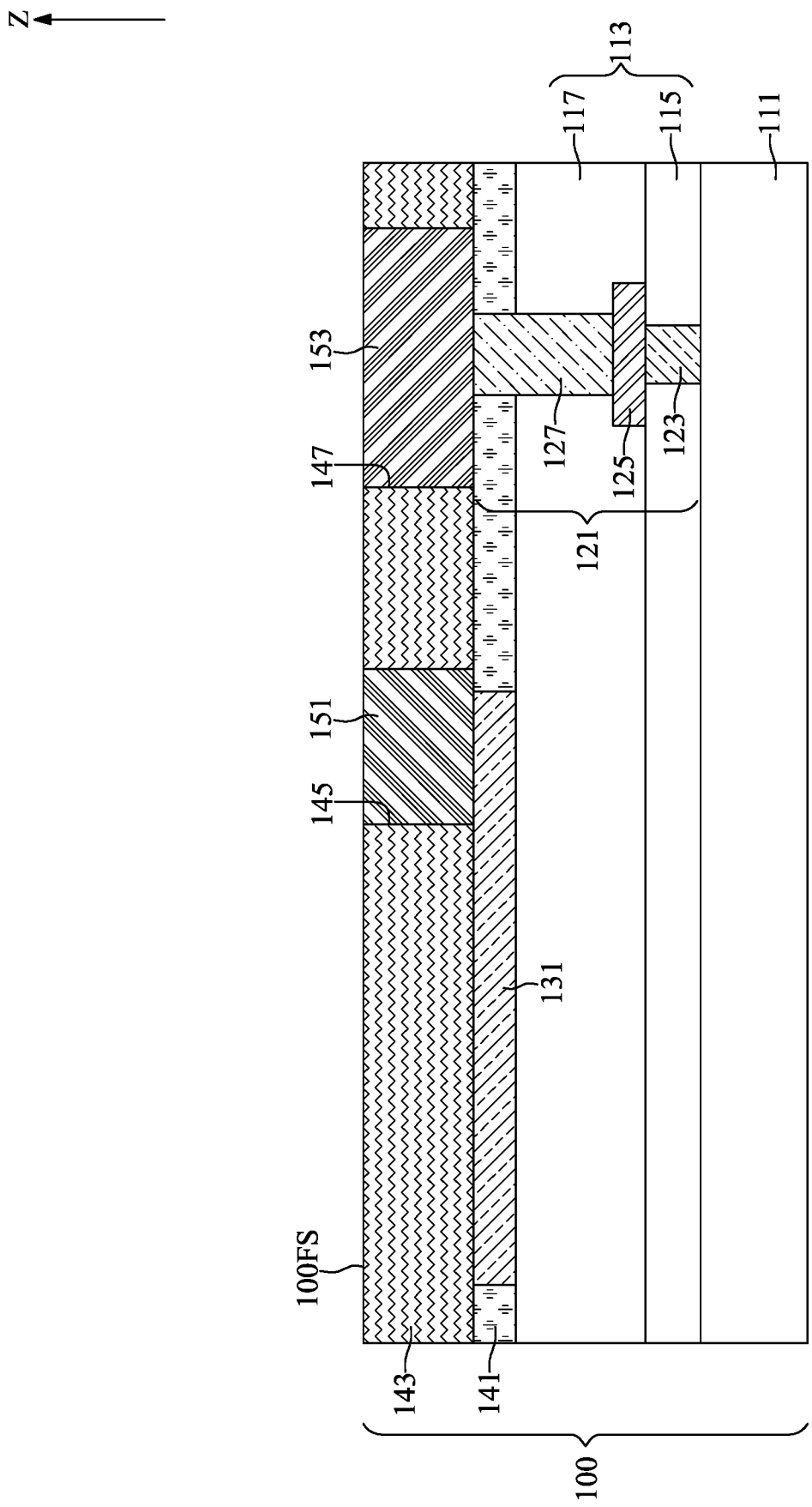

With reference to FIGS. 1, 5, and 6, at step S13, a first lower bonding pad 151 may be formed on the first redistribution layer 131, and a second lower bonding pad 153 may be formed on the plug structure 121, wherein the first substrate 111, the plug structure 121, the first redistribution layer 131, the first lower bonding pad 151, and the second lower bonding pad 153 together configure a first chip 100.

With reference to FIG. 5, a first top passivation layer 143 may be formed on the first bottom passivation layer 141. In some embodiments, the first top passivation layer 143 may be formed of a polymeric material such as polybenzoxazole, polyimide, benzocyclobutene, ajinomoto buildup film, solder resist film, or the like. The polymeric material (e.g., polyimide) may have a number of attractive characteristics such as the ability to fill openings of high aspect ratio, a relatively low dielectric constant (about 3.2), a simple depositing process, the reduction of sharp features or steps in the underlying layer, and high temperature tolerance after curing. In some embodiments, the first top passivation layer 143 may be formed by, for example, spin-coating, lamination, deposition, or the like. The deposition may include chemical vapor deposition such as plasma-enhanced chemical vapor deposition. The process temperature of the plasma-enhanced chemical vapor deposition may be between about 350° C. and about 450° C. The process pressure of the plasma-enhanced chemical vapor deposition may be between about 2.0 Torr and about 2.8 Torr. The process duration of the plasma-enhanced chemical vapor deposition may be between about 8 seconds and about 12 seconds.

With reference to FIG. 5, in some embodiments, a plurality of pad openings 145, 147 may be formed along the first top passivation layer 143. The first redistribution layer 131 may be exposed through the pad opening 145 and the top plug 127 may be exposed through the pad opening 147. The plurality pad openings 145, 147 may be formed by a photolithography process and a subsequent etching process. In some embodiments, the etching process may be an anisotropic dry etching process using argon and tetrafluoromethane as etchants. The process temperature of the etching process may be between about 120° C. and about 160° C. The process pressure of the etching process is between about 0.3 Torr and about 0.4 Torr. The process duration of the etching process may be between about 33 seconds and about 39 seconds. Alternatively, in some embodiments, the etching process may be an anisotropic dry etching process using helium and nitrogen trifluoride as etchants. The process temperature of the etching process may be between about 80° C. and about 100° C. The process pressure of the etching process is between about 1.2 Torr and about 1.3 Torr. The process duration of the etching process may be between about 20 seconds and about 30 seconds.

With reference to FIG. 6, a conductive material may be formed to fill the plurality pad openings 145, 147 to form the first lower bonding pad 151 and the second lower bonding pad 153, respectively and correspondingly. In some embodiments, the conductive material may be, for example, tungsten, cobalt, zirconium, tantalum, titanium, aluminum, ruthenium, copper, metal carbides (e.g., tantalum carbide, titanium carbide, tantalum magnesium carbide), metal nitrides (e.g., titanium nitride), transition metal aluminides, or a combination thereof. In some embodiments, the plurality pad openings 145, 147 may be sequentially filled with the conductive material by sputtering or electroless plating. For example, when the plurality pad openings 145, 147 are filled by sputtering using an aluminum-copper material as source, the process temperature of sputtering may be between about 100° C. and about 400° C. The process pressure of sputtering may be between about 1 mTorr and about 100 mTorr. For another example, the plurality pad openings 145, 147 may be filled by an electroplating process using a plating solution. The plating solution may include copper sulfate, copper methane sulfonate, copper gluconate, copper sulfamate, copper nitrate, copper phosphate, or copper chloride. The pH of the plating solution may be between about 2 and about 6 or between about 3 and about 5. The process temperature of the electroplating process may be maintained between about 40° C. and about 75° C. or between about 50° C. and about 70° C.

With reference to FIG. 6, the first lower bonding pad 151 may be formed in the pad opening 145 and may be electrically connected to the first redistribution layer 131. It should be noted that the first lower bonding pad 151 does not electrically couple to any functional units in the first substrate 111. The second lower bonding pad 153 may be formed in the pad opening 147 and may be electrically connected to the top plug 127. That is, the second lower bonding pad 153 may be in conjunction with the functional units in the first substrate 111 through the plug structure 121.

With reference to FIG. 6, the first substrate 111, the first inter-dielectric layer 113, the plug structure 121, the first redistribution layer 131, the first bottom passivation layer 141, the first top passivation layer 143, the first lower bonding pad 151, and the second lower bonding pad 153 together configure the first chip 100. In some embodiments, the first chip 100 may be configured as a logic chip. The first chip 100 may include a front surface 100FS. It should be noted that, in the description of the present disclosure, the term "front" surface is a term of art implying the major surface of the structure upon which is formed device elements and conductive features. In the present embodiment, the front surface 100FS of the first chip 100 may be the top surface of the first top passivation layer 143.

Figure 7:
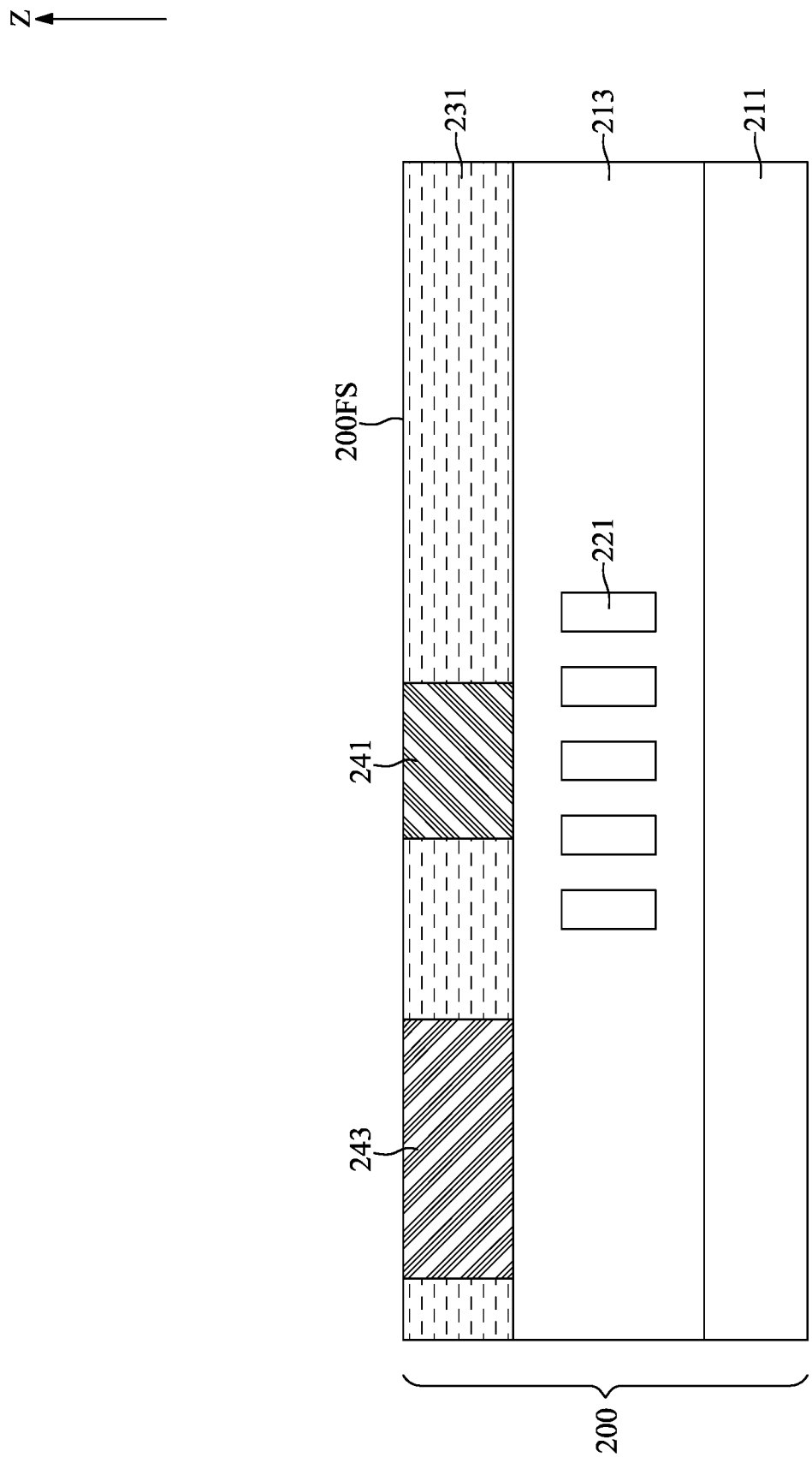

With reference to FIGS. 1 and 7, at step S15, a second chip 200 may be provided and including a plurality of storage units 221, a first upper bonding pad 241, and a second upper bonding pad 243.

With reference to FIG. 7, the second chip 200 may include a second substrate 211, a plurality of second device elements (not shown for clarity), a second inter-dielectric layer 213, a plurality of second conductive features (not shown for clarity), the plurality of storage units 221, a second top passivation layer 231, the first upper bonding pad 241, and the second upper bonding pad 243.

With reference to FIG. 7, in some embodiments, the second substrate 211 may be a bulk semiconductor substrate that is composed entirely of at least one semiconductor material; the bulk semiconductor substrate does not contain any dielectrics, insulating layers, or conductive features. The bulk semiconductor substrate may be formed of, for example, an elementary semiconductor, such as silicon or germanium; a compound semiconductor, such as silicon germanium, silicon carbide, gallium arsenide, gallium phosphide, indium phosphide, indium arsenide, indium antimonide, or other III-V compound semiconductor or II-VI compound semiconductor; or combinations thereof.

In some embodiments, the second substrate 211 may include a semiconductor-on-insulator structure which consisting of, from bottom to top, a handle substrate, an insulator layer, and a topmost semiconductor material layer. The handle substrate and the topmost semiconductor material layer may be formed of a same material as the bulk semiconductor substrate aforementioned. The insulator layer may be a crystalline or non-crystalline dielectric material such as an oxide and/or nitride. For example, the insulator layer may be a dielectric oxide such as silicon oxide. For another example, the insulator layer may be a dielectric nitride such as silicon nitride or boron nitride. For yet another example, the insulator layer may include a stack of a dielectric oxide and a dielectric nitride such as a stack of, in any order, silicon oxide and silicon nitride or boron nitride. The insulator layer may have a thickness between about 10 nm and 200 nm.

The plurality of second device elements may be formed on the second substrate 211. Some portions of the plurality of second device elements may be formed in the second substrate 211. The plurality of second device elements may be transistors such as complementary metal-oxide-semiconductor transistors, metal-oxide-semiconductor field-effect transistors, fin field-effect-transistors, the like, or a combination thereof.

With reference to FIG. 7, the second inter-dielectric layer 213 may be formed on the second substrate 211 and cover the plurality of second device elements. The second inter-dielectric layer 213 may be a stacked layer structure. The second inter-dielectric layer 213 may include a plurality of insulating sub-layers (not shown for clarity). Each of the plurality of insulating sub-layers may have a thickness between about 0.5 micrometer and about 3.0 micrometer. The plurality of insulating sub-layers may be formed of, for example, silicon oxide, borophosphosilicate glass, undoped silicate glass, fluorinated silicate glass, low-k dielectric materials, the like, or a combination thereof. The plurality of first insulating sub-layers may be formed of different materials but is not limited thereto.

The plurality of second conductive features may include interconnect layers, conductive vias, and conductive pads. The interconnect layers may be separated from each other and may be horizontally disposed in the second inter-dielectric layer 213 along the direction Z. In the present embodiment, the topmost interconnect layers may be designated as the conductive pads. The conductive vias may connect adjacent interconnect layers along the direction Z, adjacent second device element and interconnect layer, and adjacent conductive pad and interconnect layer. In some embodiments, the conductive vias may improve heat dissipation and may provide structure support. In some embodiments, the plurality of second conductive features may be formed of, for example, tungsten, cobalt, zirconium, tantalum, titanium, aluminum, ruthenium, copper, metal carbides (e.g., tantalum carbide, titanium carbide, tantalum magnesium carbide), metal nitrides (e.g., titanium nitride), transition metal aluminides, or a combination thereof. The plurality of second conductive features may be formed during the formation of the second inter-dielectric layer 213.

With reference to FIG. 7, the plurality of storage units 221 may be formed in the second inter-dielectric layer 213 and may electrically couple to the plurality of second conductive features. In some embodiments, the plurality of storage units 221 may be configured as a capacitor array. In some embodiments, the plurality of storage units 221 may be configured as a floating array.

With reference to FIG. 7, the second top passivation layer 231 may be formed on the second inter-dielectric layer 213. In some embodiments, the second top passivation layer 231 may be formed of a polymeric material such as polybenzoxazole, polyimide, benzocyclobutene, ajinomoto buildup film, solder resist film, or the like. The polymeric material (e.g., polyimide) may have a number of attractive characteristics such as the ability to fill openings of high aspect ratio, a relatively low dielectric constant (about 3.2), a simple depositing process, the reduction of sharp features or steps in the underlying layer, and high temperature tolerance after curing. In some embodiments, the second top passivation layer 231 may be formed by, for example, spin-coating, lamination, deposition, or the like. The deposition may include chemical vapor deposition such as plasma-enhanced chemical vapor deposition. The process temperature of the plasma-enhanced chemical vapor deposition may be between about 350° C. and about 450° C. The process pressure of the plasma-enhanced chemical vapor deposition may be between about 2.0 Torr and about 2.8 Torr. The process duration of the plasma-enhanced chemical vapor deposition may be between about 8 seconds and about 12 seconds.

With reference to FIG. 7, the first upper bonding pad 241 and the second upper bonding pad 243 may be formed in the second top passivation layer 231. In some embodiments, pad openings (not shown in FIG. 7) may be formed in the second top passivation layer 231 and a conductive material may be formed to fill the pad openings to form the first upper bonding pad 241 and the second upper bonding pad 243. The pad opening may be formed by a photolithography process and a subsequent etching process. In some embodiments, the etching process may be an anisotropic dry etching process using argon and tetrafluoromethane as etchants. The process temperature of the etching process may be between about 120° C. and about 160° C. The process pressure of the etching process is between about 0.3 Torr and about 0.4 Torr. The process duration of the etching process may be between about 33 seconds and about 39 seconds. Alternatively, in some embodiments, the etching process may be an anisotropic dry etching process using helium and nitrogen trifluoride as etchants. The process temperature of the etching process may be between about 80° C. and about 100° C. The process pressure of the etching process is between about 1.2 Torr and about 1.3 Torr. The process duration of the etching process may be between about 20 seconds and about 30 seconds. In some embodiments, the conductive material may be, for example, tungsten, cobalt, zirconium, tantalum, titanium, aluminum, ruthenium, copper, metal carbides (e.g., tantalum carbide, titanium carbide, tantalum magnesium carbide), metal nitrides (e.g., titanium nitride), transition metal aluminides, or a combination thereof.

In some embodiments, the pad openings may be sequentially filled with the conductive material by sputtering or electroless plating. For example, when the pad opening are filled by sputtering using an aluminum-copper material as source, the process temperature of sputtering may be between about 100° C. and about 400° C. The process pressure of sputtering may be between about 1 mTorr and about 100 mTorr. For another example, the pad openings may be filled by an electroplating process using a plating solution. The plating solution may include copper sulfate, copper methane sulfonate, copper gluconate, copper sulfamate, copper nitrate, copper phosphate, or copper chloride. The pH of the plating solution may be between about 2 and about 6 or between about 3 and about 5. The process temperature of the electroplating process may be maintained between about 40° C. and about 75° C. or between about 50° C. and about 70° C.

In some embodiments, the second chip 200 may be configured as a memory chip. The first upper bonding pad 241 and the second upper bonding pad 243 may be configured to serve as input/output of the memory chip. The second chip 200 may include a front surface 200FS. In the present embodiment, the front surface 200FS of the second chip 200 may be the top surface of the second top passivation layer 231.

Figure 8:
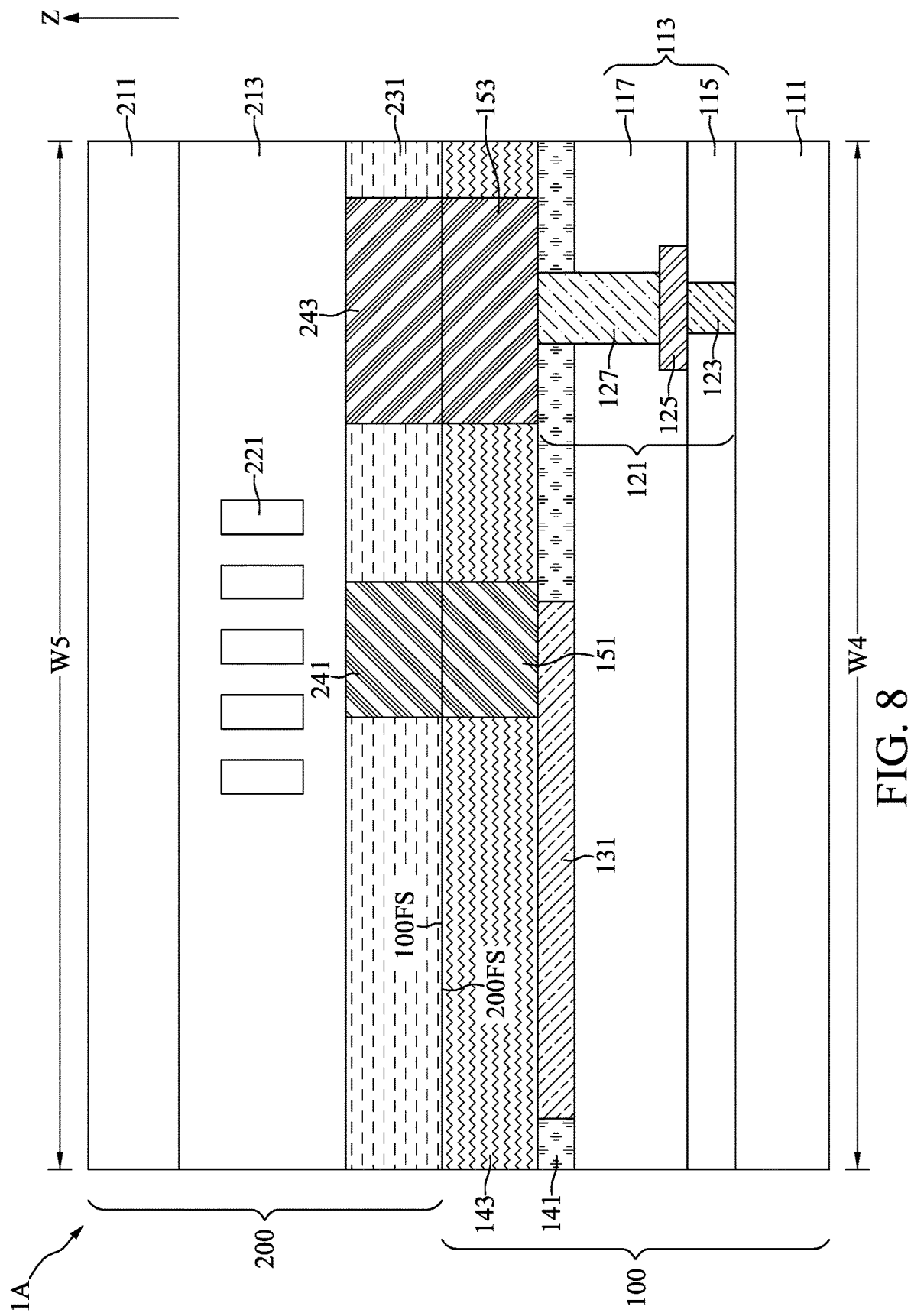

With reference to FIGS. 1 and 8, at step S17, the second chip 200 may be bonded onto the first chip 100 to form the semiconductor device 1A.

With reference to FIG. 8, the second chip 200 may be bonded onto the first chip 100 in a face-to-face configuration through a hybrid bonding process. The front surface 200FS of the second chip 200 may be bonded onto the front surface 100FS of the first chip 100. After the hybrid bonding process, the second chip 200 (configured as the memory chip) and the first chip 100 (configured as the logic chip) may together configure an integrated circuit package. For example, the second upper bonding pad 243 may be disposed on the second lower bonding pad 153. That is, the second upper bonding pad 243 may be in conjunction with the functional units of the first chip 100 through the plug structure 121. Signal such as control signal may be transmitted from the first chip 100 to the plurality of storage units 221 through the plug structure 121, the second lower bonding pad 153, and the second upper bonding pad 243. The first upper bonding pad 241 may be disposed on the first lower bonding pad 151. Signal such as data signal may be transmitted from the plurality of storage units 221 through the first upper bonding pad 241, the first lower bonding pad 151, and the first redistribution layer 131 to an external reading unit without passing through the conductive features, the plug structure 121, and functional units of the first chip 100.

In some embodiments, the hybrid bonding process may be, for example, thermo-compression bonding, passivation-capping-layer assisted bonding, or surface activated bonding. For example, the hybrid bonding process may include activating exposed surfaces of the second top passivation layer 231 of the second chip 200 and the first top passivation layer 143 (e.g., in a plasma process), cleaning the second top passivation layer 231 and the first top passivation layer 143 after activation, contacting the activated surface of the second top passivation layer 231 and the activated surface of the first top passivation layer 143, and performing a thermal annealing process to strengthen the bonding between the second top passivation layer 231 and the first top passivation layer 143.

In some embodiments, the process pressure of the hybrid bonding process may be between about 100 MPa and about 150 MPa. In some embodiments, the process temperature of the hybrid bonding process may be between about room temperature (e.g., 25° C.) and about 400° C. In some embodiments, surface treatments such as wet chemical cleaning and gas/vapor-phase thermal treatments may be used to lower the process temperature of the hybrid bonding process or to shorten the time consuming of the hybrid bonding process.

In some embodiments, the hybrid bonding process may include dielectric-to-dielectric bonding, metal-to-metal bonding, and metal-to-dielectric bonding. The dielectric-to-dielectric bonding may originate from the bonding between the second top passivation layer 231 and the first top passivation layer 143. The metal-to-metal bonding may originate from the bonding between the first upper bonding pad 241 and the first lower bonding pad 151, and between the second upper bonding pad 243 and the second lower bonding pad 153. The metal-to-dielectric bonding may originate from the bonding between the first top passivation layer 143 and the first upper bonding pad 241 and the second upper bonding pad 243, and between the second top passi-vation layer 231 and the first lower bonding pad 151 and the second lower bonding pad 153.

In some embodiments, when the first top passivation layer 143 and the second top passivation layer 231 are formed of, for example, silicon oxide or silicon nitride, the bonding between the first top passivation layer 143 and the second top passivation layer 231 may be based on the hydrophilic bonding mechanism. Hydrophilic surface modifications may be applied to the first top passivation layer 143 and the second top passivation layer 231 before bonding.

In some embodiments, when the first top passivation layer 143 and the second top passivation layer 231 are formed of polymer adhesives such as polyimide, benzocyclobutenes, and polybenzoxazole, the bonding between the first top passivation layer 143 and the second top passivation layer 231 may be based on thermo-compression bonding.

In some embodiments, a thermal annealing process may be performed after the bonding process to enhance dielectric-to-dielectric bonding and to induce thermal expansion of metal-to-metal bonding so as to further improve the bonding quality.

With reference to FIG. 8, in some embodiments, the width W4 of the first chip 100 and the width W5 of the second chip 200 may be substantially the same.

Figure 9:
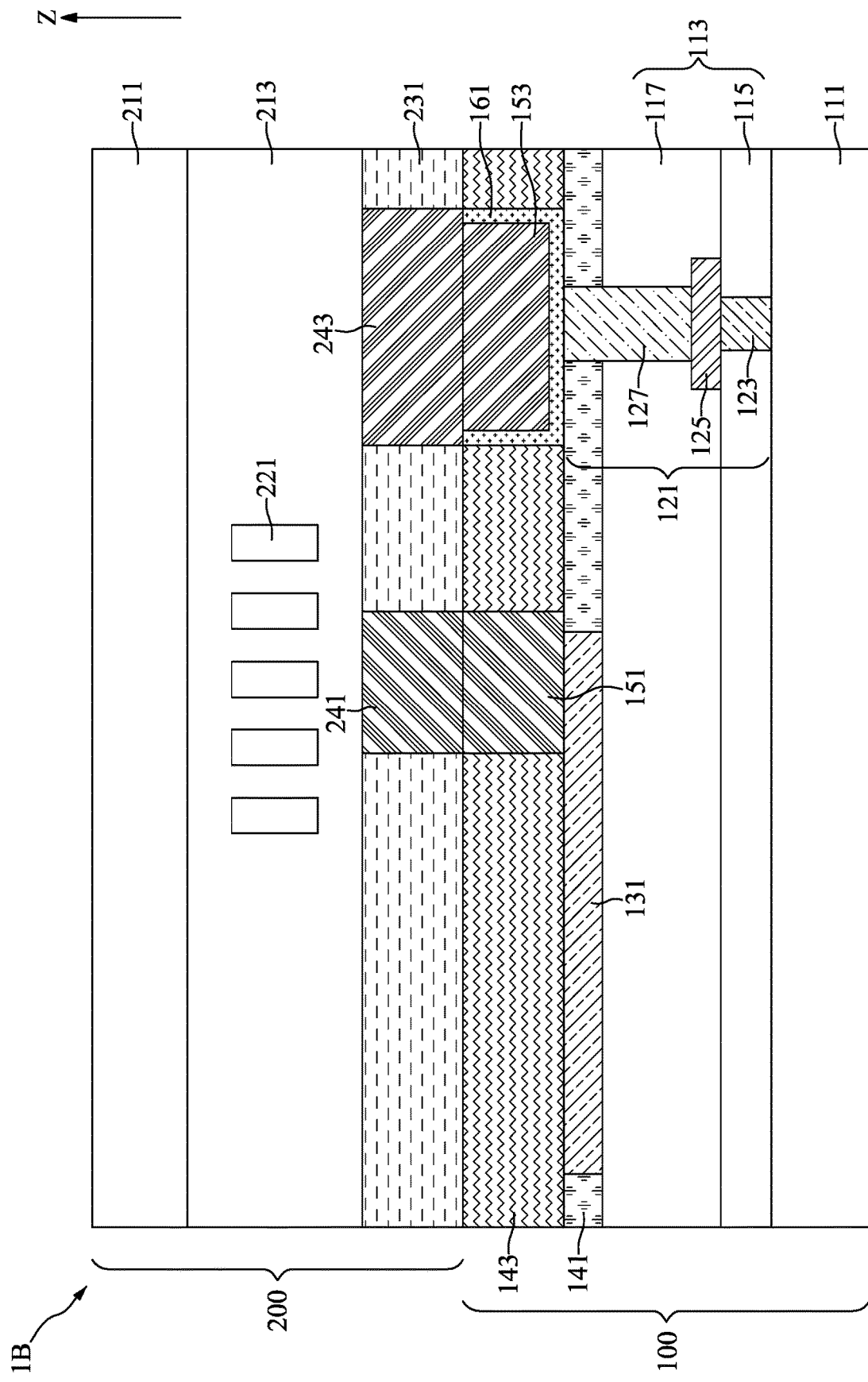
FIGS. 9 to 11 illustrate, in schematic cross-sectional view diagrams, semiconductor devices in accordance with some embodiments of the present disclosure.
Figure 10:
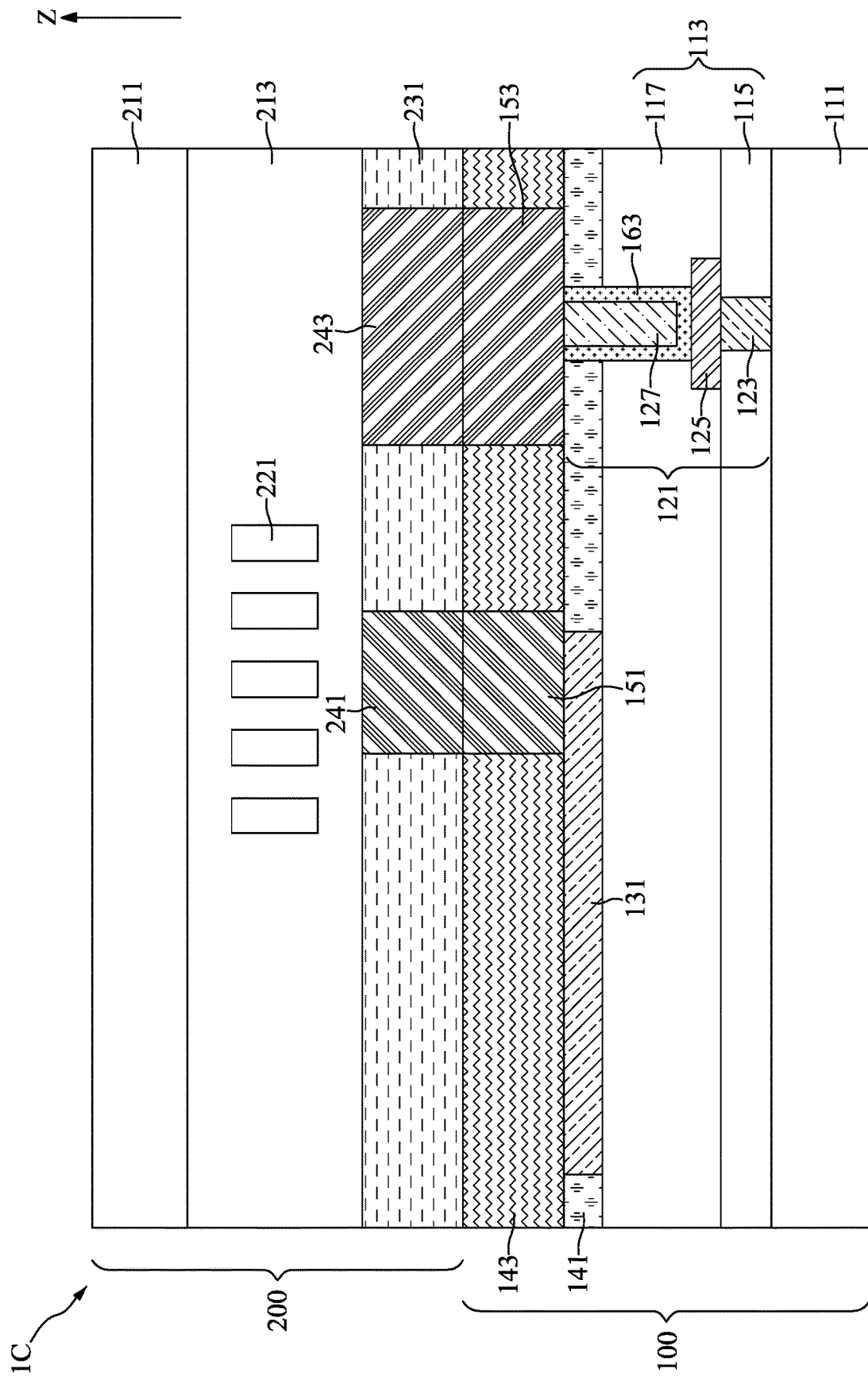
Figure 11:
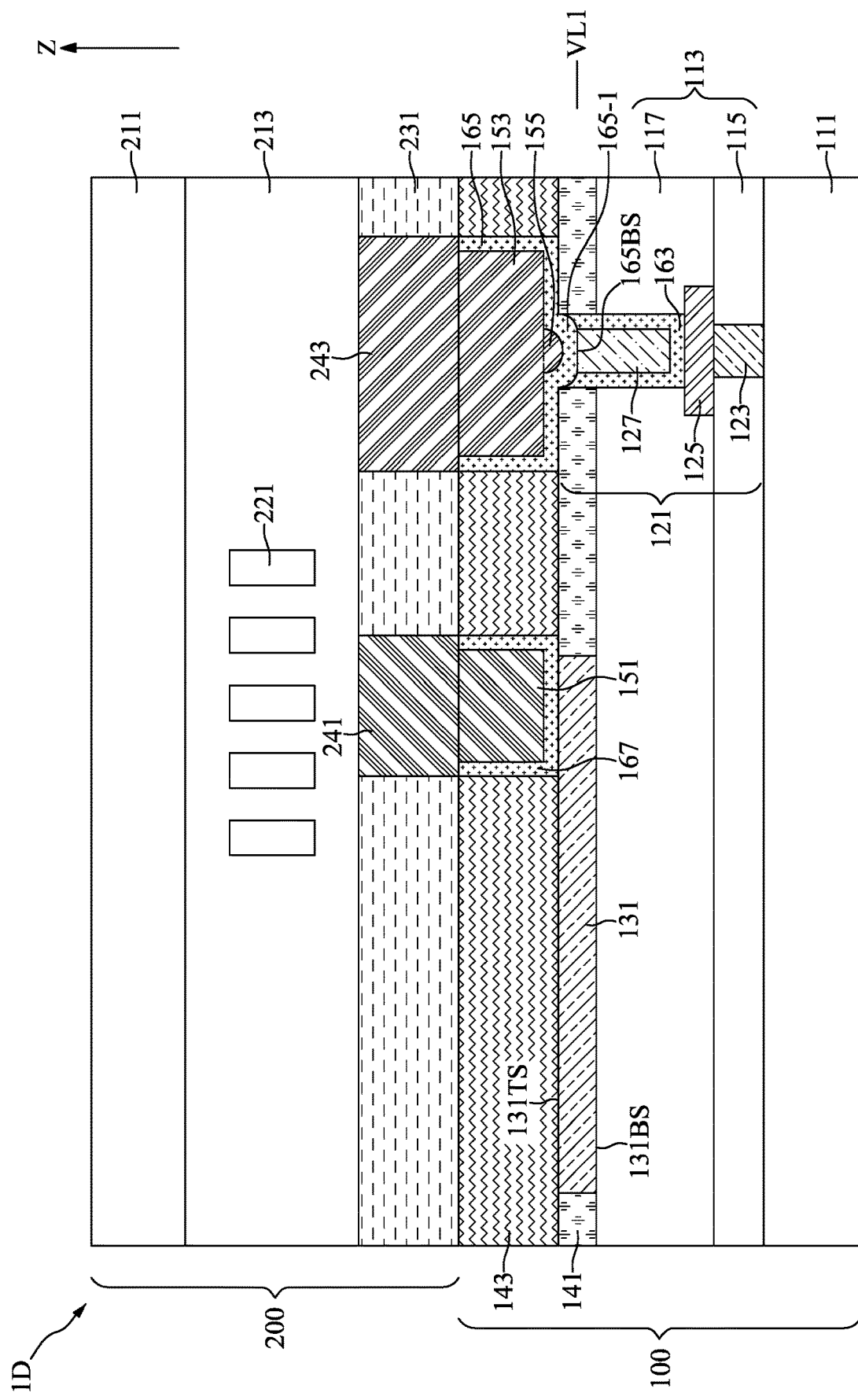

FIGS. 9 to 11 illustrate, in schematic cross-sectional view diagrams, semiconductor devices 1B, 1C, and 1D in accordance with some embodiments of the present disclosure.

With reference to FIG. 9, the semiconductor device 1B may include a first barrier layer 161 disposed between the first top passivation layer 143 and the second lower bonding pad 153, between the top plug 127 and the second lower bonding pad 153, and between the second lower bonding pad 153 and the first bottom passivation layer 141. The first barrier layer 161 may be formed of, for example, titanium, titanium nitride, or a combination thereof. The first barrier layer 161 may be formed by, for example, atomic layer deposition, physical vapor deposition, chemical vapor deposition, or other applicable deposition process.

With reference to FIG. 10, the semiconductor device 1C may include a second barrier layer 163 disposed between the first bottom passivation layer 141 and the top plug 127, between the top dielectric layer 117 and the top plug 127, and between the landing pad 125 and the top plug 127. The second barrier layer 163 may be formed of the same material as the first barrier layer 161, and descriptions thereof are not repeated herein.

With reference to FIG. 11, in the semiconductor device 1D, a second barrier layer 163 may be disposed between the first bottom passivation layer 141 and the top plug 127, between the top dielectric layer 117 and the top plug 127, and between the landing pad 125 and the top plug 127. In some embodiments, the second barrier layer 163 may have a U-shaped cross-sectional profile extending toward the landing pad 125. The top surface of the second barrier layer 163 and the top surface of the top plug 127 may be recessed to a vertical level VL1 between the top surface 131TS and the bottom surface 131BS of the first redistribution layer 131. A third barrier layer 165 may be conformally disposed between the second lower bonding pad 153 and the top plug 127. In some embodiments, the third barrier layer 165 may further include a U-shaped protrusion 165-1 extending toward the top plug 127 and disposed on the top surface of the top plug 127. In other words, the bottom surface 165BS of the U-shaped protrusion 165-1 (i.e., the bottom surface of the third barrier layer 165) may be lower than the top surface 131TS of the first redistribution layer 131 and higher than top surface 131TS and the bottom surface 131BS of the first redistribution layer 131. Accordingly, the second lower bonding pad 153 may further include a protrusion portion 155 extending toward the top plug 127 and disposed in the recess configured by the U-shaped protrusion 165-1. In some embodiments, the bottom surface 165BS of the U-shaped protrusion 165-1 may be rounding. In some embodiments, the bottom surface 165BS of the U-shaped protrusion 165-1 may be substantially flat. A fourth barrier layer 167 may be conformally disposed between the first lower bonding pad 151 and the first redistribution layer 131. The third barrier layer 165 and the fourth barrier layer 167 may be formed of a same material as the first barrier layer 161, and descriptions thereof are not repeated herein.

Figure 12:
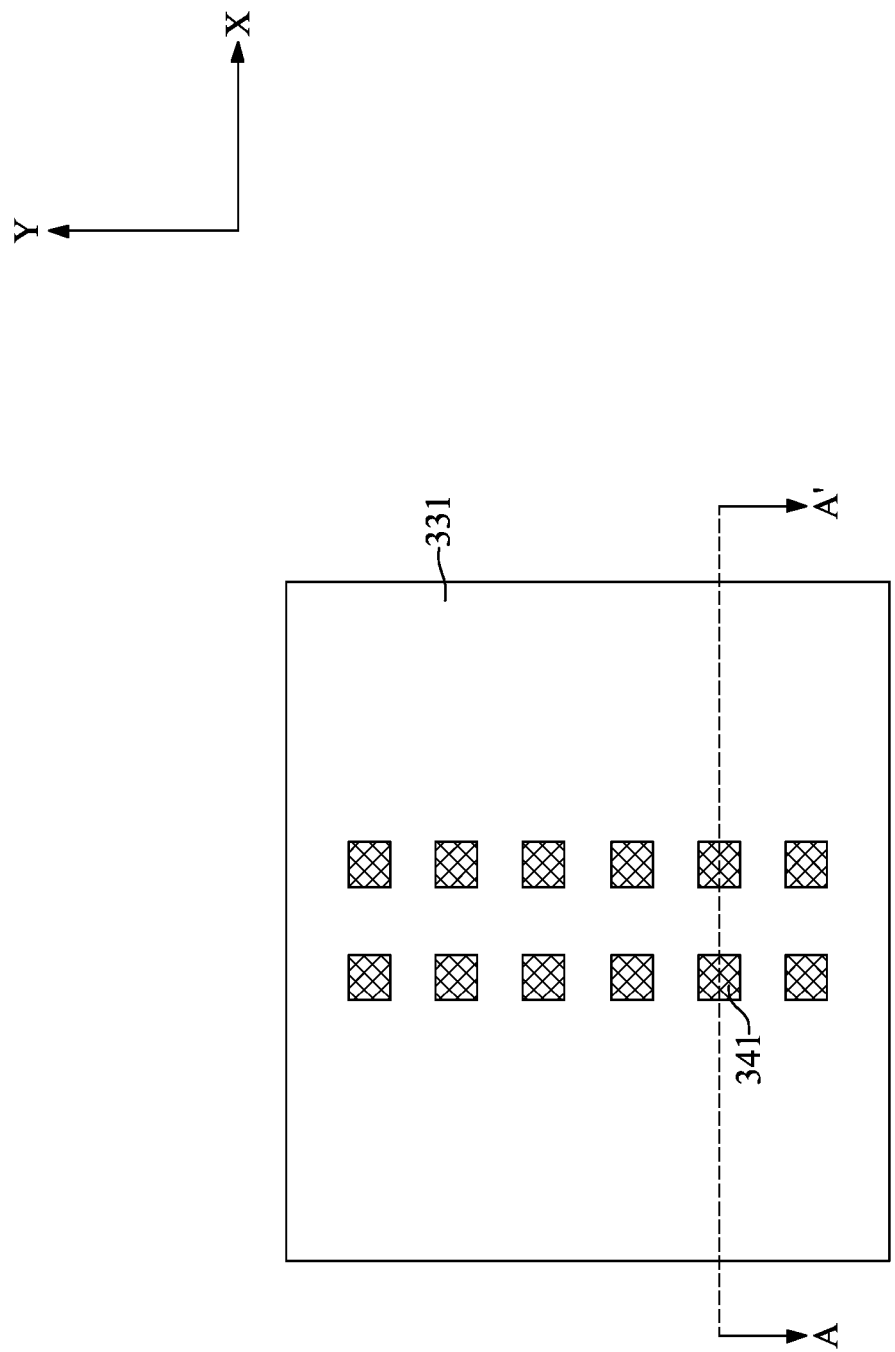
FIG. 12 illustrates, in a schematic top-view diagram, part of a flow for fabricating a semiconductor device in accordance with another embodiment of the present disclosure.
Figure 13:
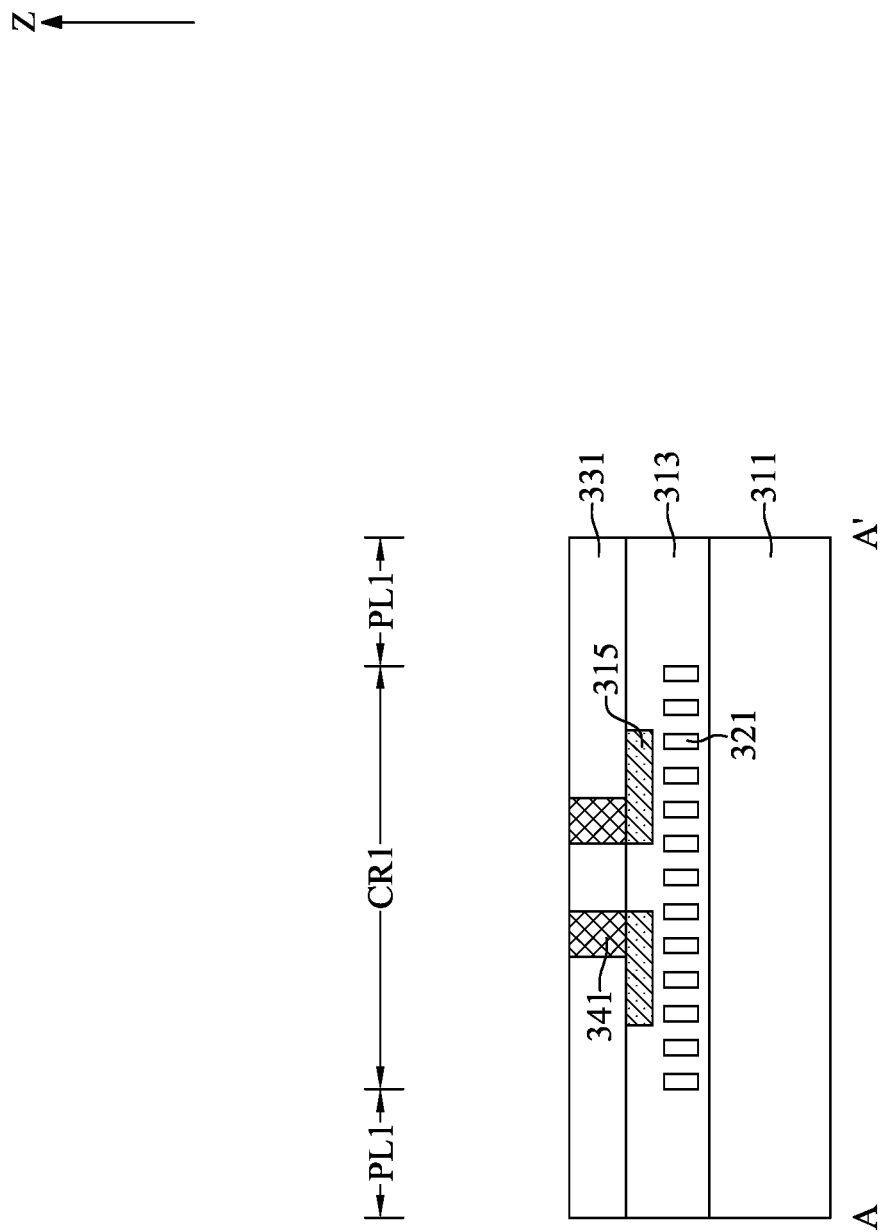
FIG. 13 is a schematic cross-sectional view diagram taken along a line A-A' in FIG. 12.

FIG. 12 illustrates, in a schematic top-view diagram, part of a flow for fabricating a semiconductor device 1E in accordance with another embodiment of the present disclosure. FIG. 13 is a schematic cross-sectional view diagram taken along a line A-A' in FIG. 12.

With reference to FIGS. 12 and 13, a third substrate 311 may be provided. The third substrate 311 may include a center region CR1 and a peripheral region PL1 surrounding the center region CR1. A third bottom inter-dielectric layer 313 may be formed on the third substrate 311. A plurality of storage units 321 may be formed in the third bottom inter-dielectric layer 313. In some embodiments, the plurality of storage units 321 may be configured as capacitor array. In some embodiments, the plurality of storage units 321 may be configured as floating array. A plurality of interconnection layers 315 may be formed in the third bottom inter-dielectric layer 313 and may be electrically coupled to the plurality of storage units 321. A third bottom passivation layer 331 may be formed on the third bottom inter-dielectric layer 313. A plurality of center lower bonding pads 341 may be formed on the plurality of interconnection layers 315, respectively and correspondingly. The plurality of center lower bonding pads 341 may be located at the center region CR1.

The third substrate 311, the third bottom inter-dielectric layer 313, the third bottom inter-dielectric layer 313, the plurality of storage units 321, the plurality of interconnection layers 315, the third bottom passivation layer 331, and the plurality of center lower bonding pads 341 may be formed with procedures similar to the second substrate 211, the second inter-dielectric layer 213, the plurality of storage units 221, the second conductive features, the second top passivation layer 231, and the first upper bonding pad 241, respectively and correspondingly, and descriptions thereof are not repeated herein.

Figure 14:
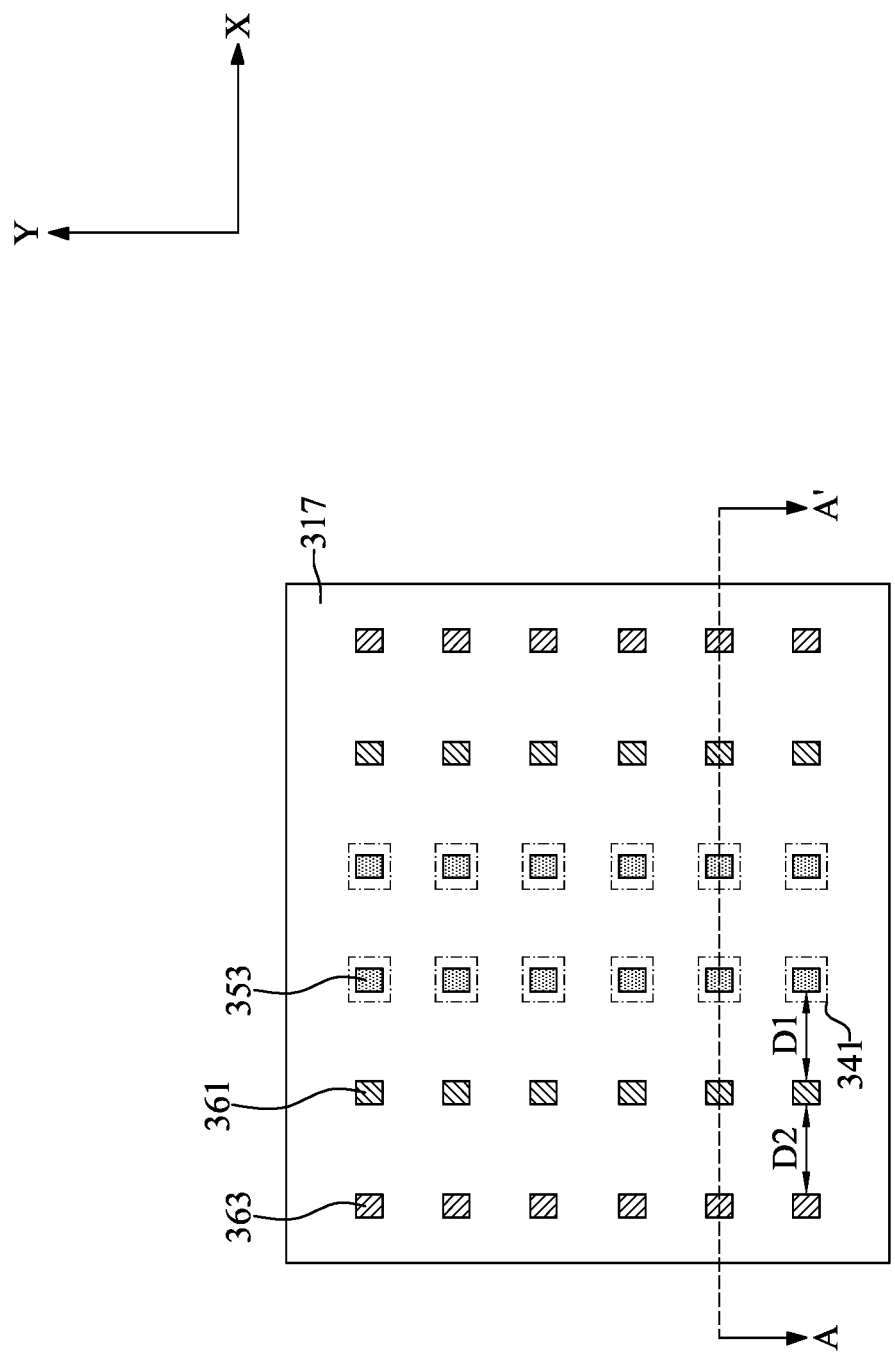
FIG. 14 illustrates, in a schematic top-view diagram, part of the flow for fabricating a semiconductor device in accordance with another embodiment of the present disclosure.
Figure 15:
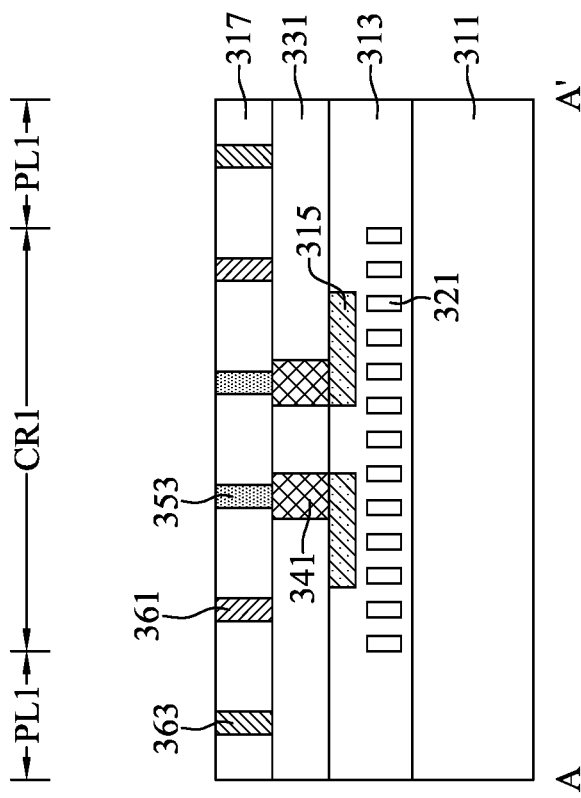
FIG. 15 is a schematic cross-sectional view diagram taken along a line A-A' in FIG. 14.

FIG. 14 illustrates, in a schematic top-view diagram, part of the flow for fabricating a semiconductor device 1E in accordance with another embodiment of the present disclosure. FIG. 15 is a schematic cross-sectional view diagram taken along a line A-A' in FIG. 14.

With reference to FIGS. 14 and 15, a third top inter-dielectric layer 317 may be formed on the third bottom passivation layer 331. A plurality of redistribution plugs 353 may be formed on the plurality of center lower bonding pads 341, respectively and correspondingly. The plurality of redistribution plugs 353 may be formed in the third top inter-dielectric layer 317 and may be located at the center region CR1. A plurality of first supporting plugs 361 and a plurality of second supporting plugs 363 may be formed in the third top inter-dielectric layer 317.

For brevity, clarity, and convenience of description, only one redistribution plug 353, one first supporting plug 361, and one second supporting plug 363 are described. The distance D1 between the adjacent pair of the redistribution plug 353 and the first supporting plug 361 is about the same as the distance D2 between the adjacent pair of the first supporting plug 361 and the second supporting plug 363.

The third top inter-dielectric layer 317, the redistribution plug 353, the first supporting plug 361, and the second supporting plug 363 may be formed with procedures similar to the third bottom passivation layer 331 and the top plug 127, respectively and correspondingly, and descriptions thereof are not repeated herein.

Figure 16:
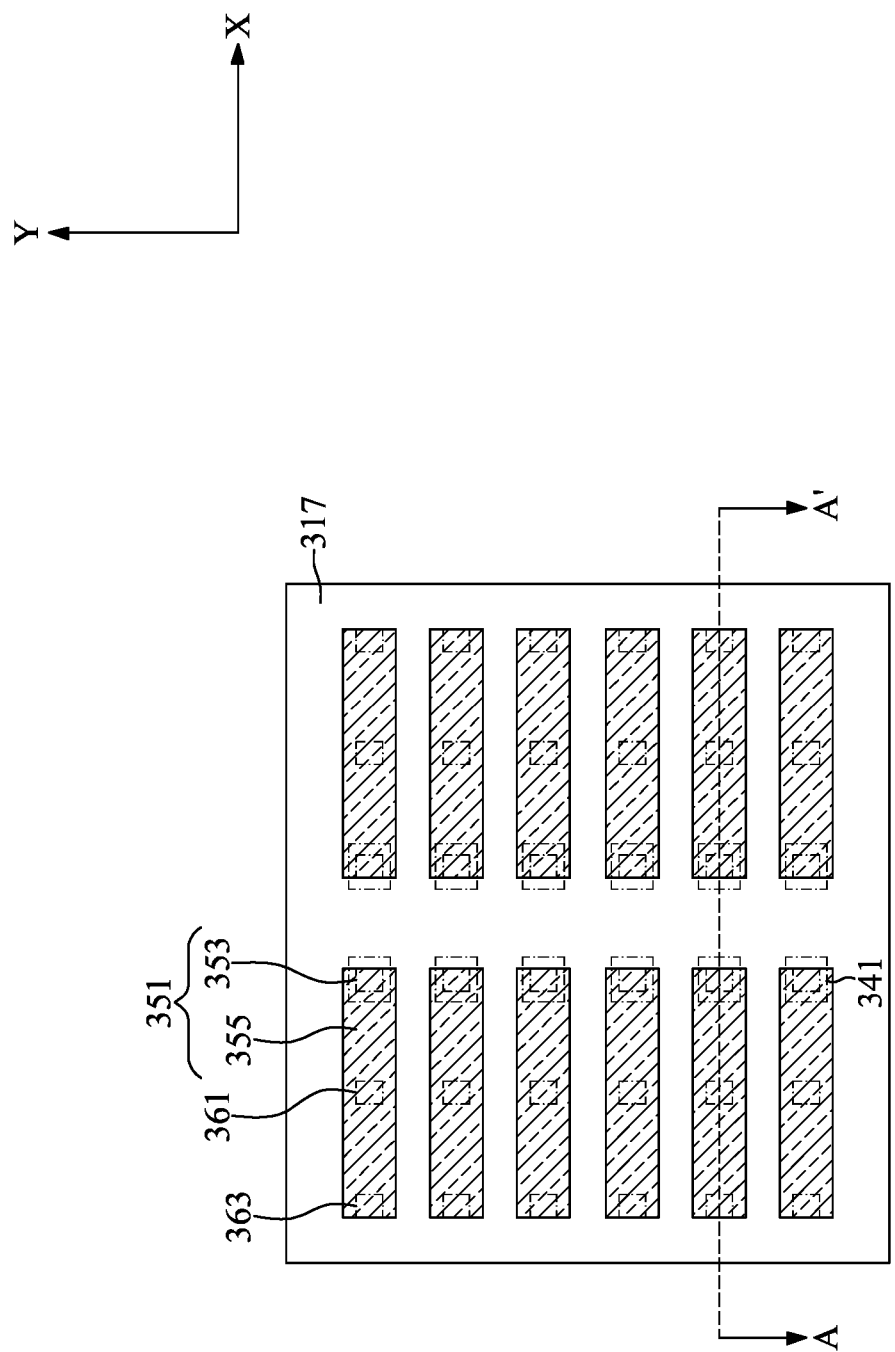
FIG. 16 illustrates, in a schematic top-view diagram, part of the flow for fabricating a semiconductor device in accordance with another embodiment of the present disclosure.
Figure 17:
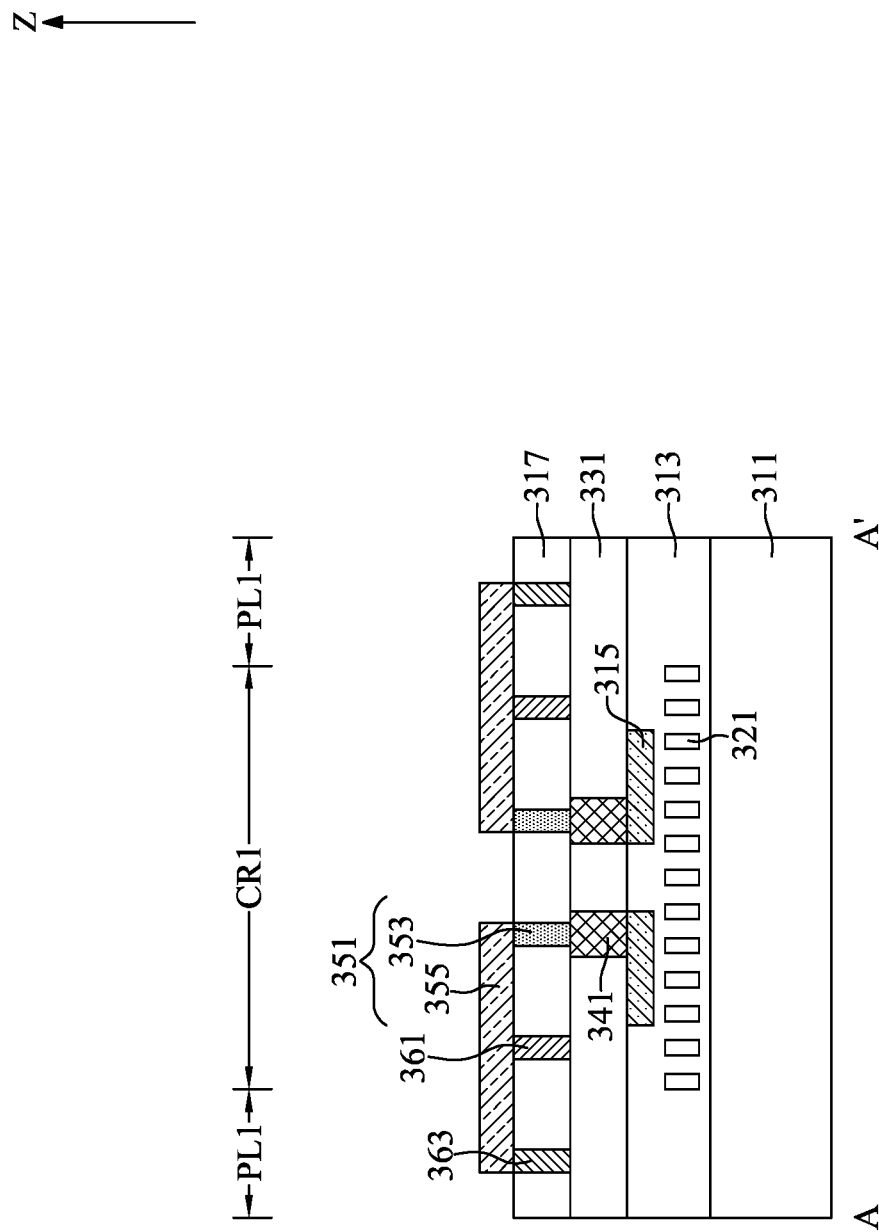
FIG. 17 is a schematic cross-sectional view diagram taken along a line A-A' in FIG. 16.

FIG. 16 illustrates, in a schematic top-view diagram, part of the flow for fabricating a semiconductor device 1E in accordance with another embodiment of the present disclosure. FIG. 17 is a schematic cross-sectional view diagram taken along a line A-A' in FIG. 16.

With reference to FIGS. 16 and 17, a plurality of second redistribution layers 355 may be formed on the third top inter-dielectric layer 317. For brevity, clarity, and convenience of description, only one second redistribution layer 355 is described. The second redistribution layer 355 may be formed on the redistribution plug 353, the first supporting plug 361, and the second supporting plug 363. The redistribution plug 353 and the second redistribution layer 355 may together configure a redistribution structure 351. The first supporting plug 361 and the second supporting plug 363 may be floating. The first supporting plug 361 and the second supporting plug 363 may provide additional supporting during a following bonding process as will be illustrated later. The second redistribution layer 355 may be formed with a procedure similar to the first redistribution layer 131, and descriptions thereof are not repeated herein.

Figure 18:
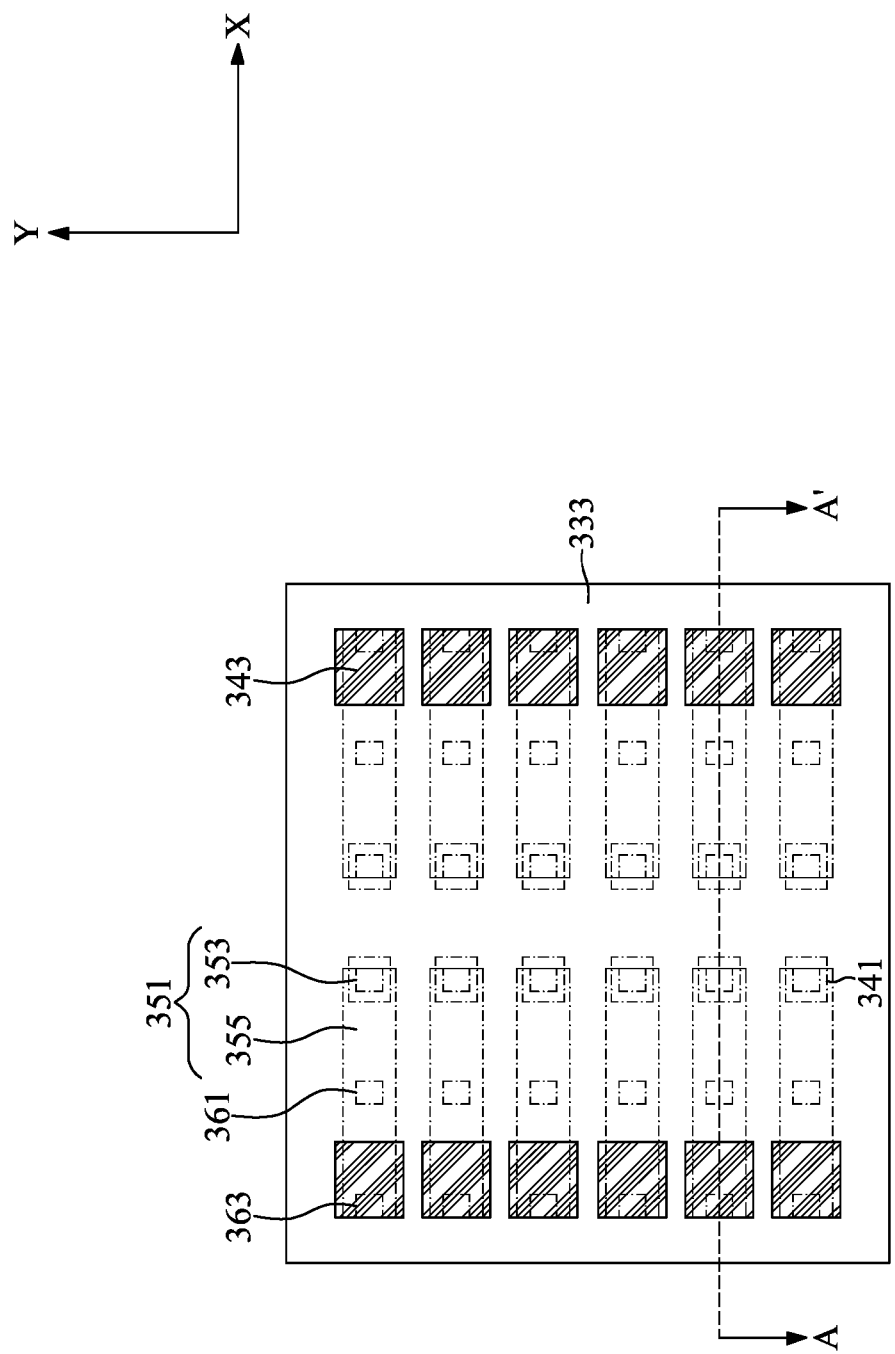
FIG. 18 illustrates, in a schematic top-view diagram, part of the flow for fabricating a semiconductor device in accordance with another embodiment of the present disclosure.
Figure 19:
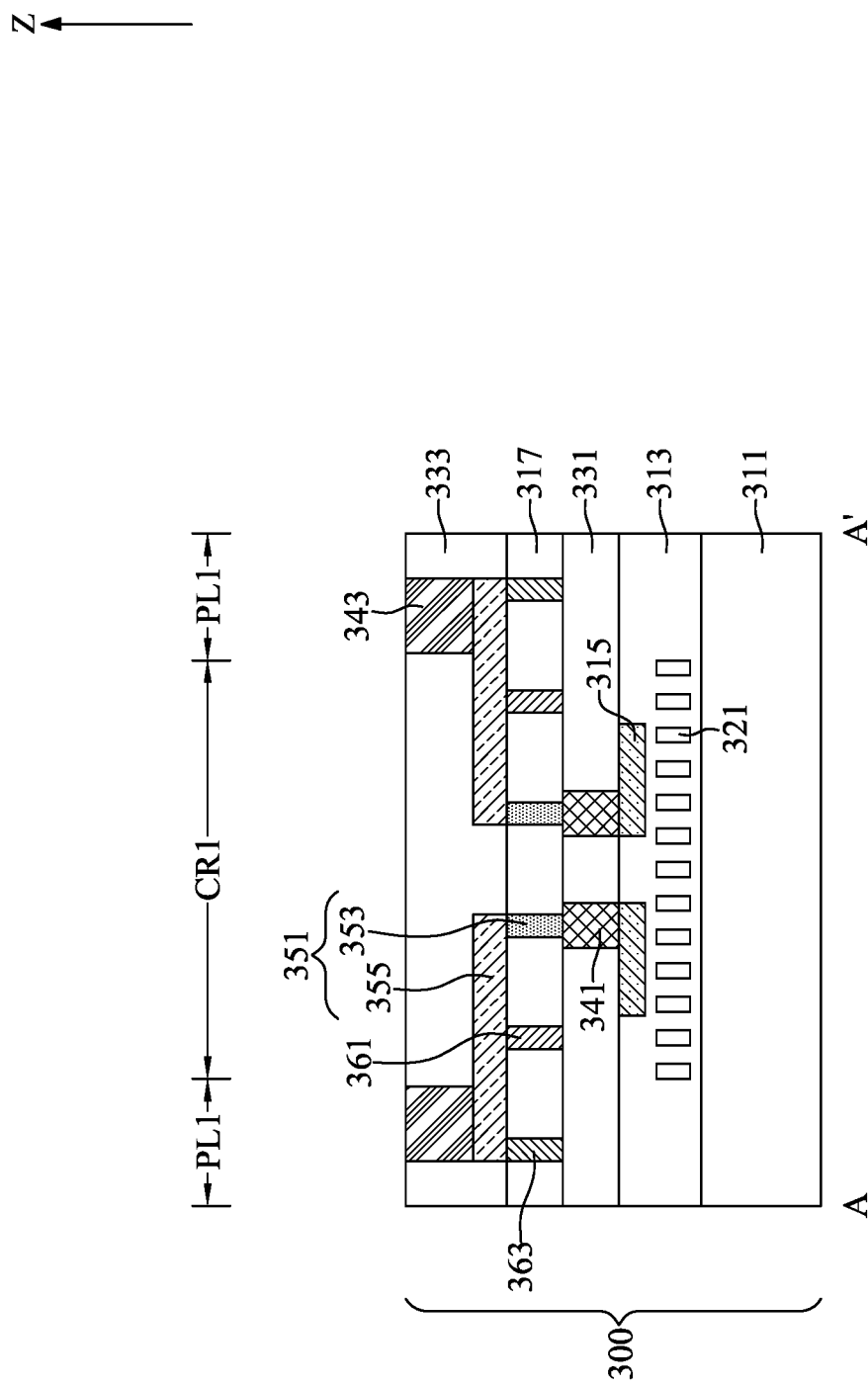
FIG. 19 is a schematic cross-sectional view diagram taken along a line A-A' in FIG. 18.

FIG. 18 illustrates, in a schematic top-view diagram, part of the flow for fabricating a semiconductor device 1E in accordance with another embodiment of the present disclosure. FIG. 19 is a schematic cross-sectional view diagram taken along a line A-A' in FIG. 18.

With reference to FIGS. 18 and 19, a third top passivation layer 333 may be formed on the third top inter-dielectric layer 317 to cover the plurality of second redistribution layers 355. A plurality of peripheral upper bonding pads 343 may be formed on the plurality of second redistribution layers 355, respectively and correspondingly. The plurality of peripheral upper bonding pads 343 may be formed in the third top passivation layer 333 and may be located at the peripheral region PL1.

The third substrate 311, the third bottom inter-dielectric layer 313, the plurality of interconnection layers 315, the third top inter-dielectric layer 317, the plurality of storage units 321, the third bottom passivation layer 331, the plurality of center lower bonding pads 341, the plurality of redistribution structures 351, the plurality of first supporting plugs 361, the plurality of second supporting plugs 363, the third top passivation layer 333, and the plurality of peripheral upper bonding pads 343 together configure a third chip 300. In some embodiments, the third chip 300 may be configured as a memory chip. The plurality of peripheral upper bonding pads 343 may be configured as input/output of the third chip 300. The plurality of redistribution structures 351 may in conjunction with the plurality of center lower bonding pads 341 to transmit signal of the plurality of storage units 321 from center region CR2 to the plurality of peripheral upper bonding pads 343 which are at peripheral region PL1 of the third chip 300.

FIGS. 20 to 23 illustrate, in schematic cross-sectional view diagrams, part of the flow for fabricating the semiconductor device 1E in accordance with another embodiment of the present disclosure.

Figure 20:
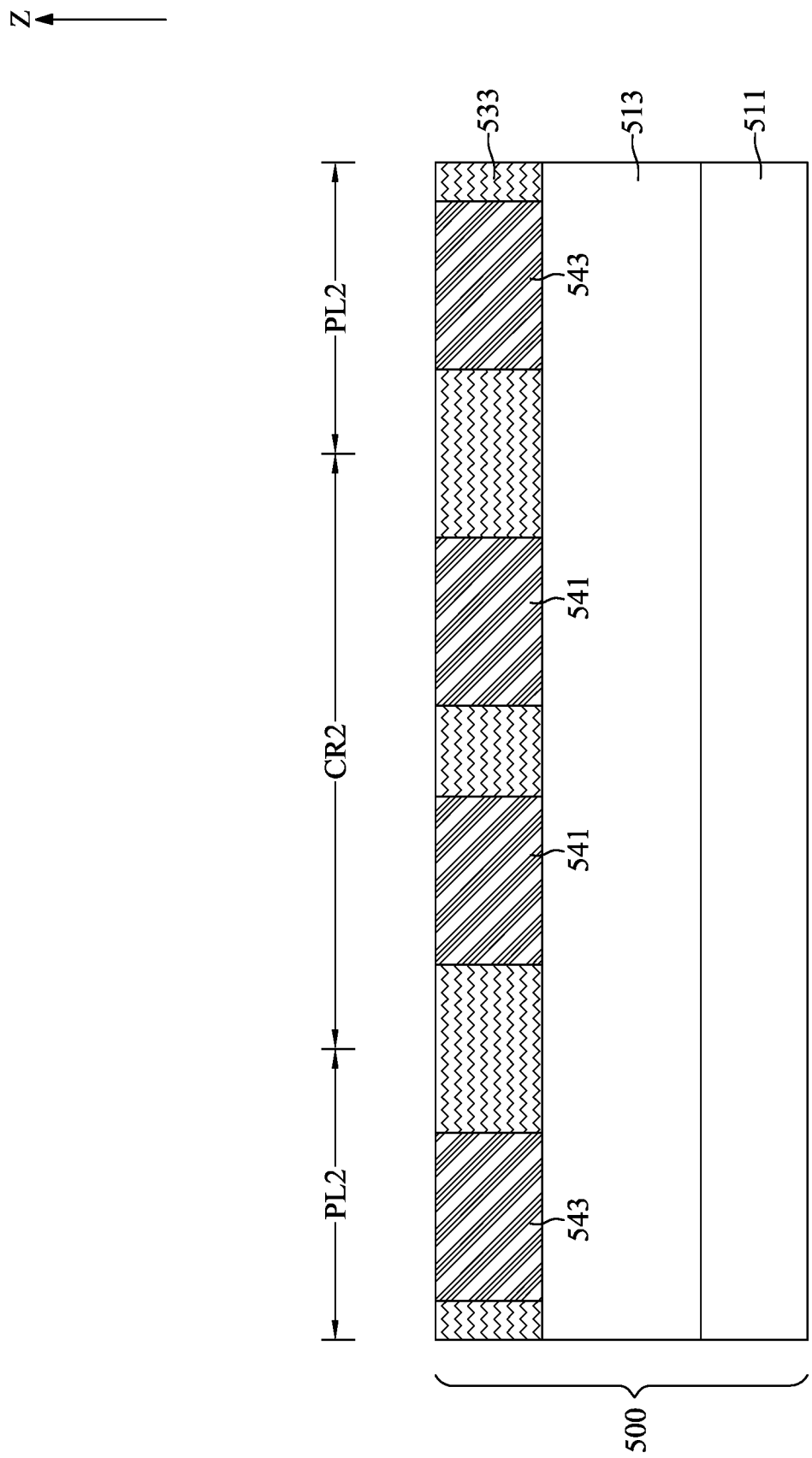
FIGS. 20 to 22 illustrate, in schematic cross-sectional view diagrams, part of the flow for fabricating the semiconductor device in accordance with another embodiment of the present disclosure.

With reference to FIG. 20, a fifth chip 500 may be provided. The fifth chip 500 may include a fifth substrate 511, a fifth inter-dielectric layer 513, a fifth top passivation layer 533, a plurality of fifth center bonding pads 541, and a plurality of fifth peripheral bonding pads 543. The fifth substrate 511 may include a center region CR2 and a peripheral region PL2 surrounding the center region CR2. The fifth inter-dielectric layer 513 may be formed on the fifth substrate 511. The fifth top passivation layer 533 may be formed on the fifth inter-dielectric layer 513. The plurality of fifth center bonding pads 541 and the plurality of fifth peripheral bonding pads 543 may be formed in the fifth top passivation layer 533. The plurality of fifth center bonding pads 541 may be located at the center region CR2 and the plurality of fifth peripheral bonding pads 543 may be located at the peripheral region PL2.

The fifth substrate 511, the fifth inter-dielectric layer 513, the fifth inter-dielectric layer 513, the plurality of fifth center bonding pads 541, and the plurality of fifth peripheral bonding pads 543 may be formed with procedures similar to the first substrate 111, the first inter-dielectric layer 113, the first top passivation layer 143, and the first lower bonding pad 151, respectively and correspondingly, and descriptions thereof are not repeated herein. In some embodiments, the fifth chip 500 may be configured as a logic chip.

Figure 21:
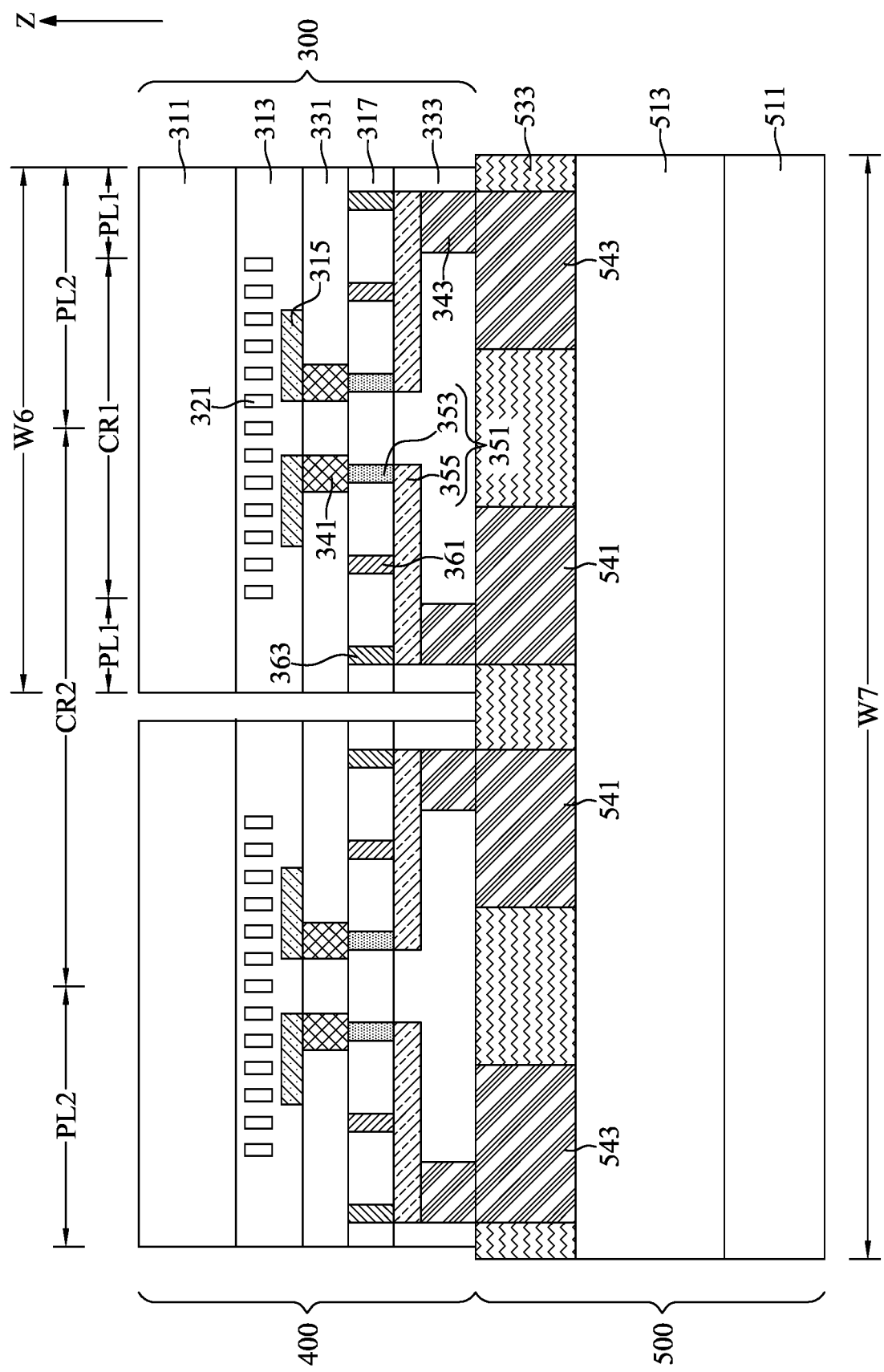

With reference to FIG. 21, a fourth chip 400 may be formed with a procedure similar to the third chip 300, and descriptions thereof are not repeated herein. The third chip 300 may be bonded onto the fifth chip 500 through a hybrid bonding process similar to that illustrated in FIG. 8, and descriptions thereof are not repeated herein. In some embodiments, the width W6 of the third chip 300 is less than the width W7 of the fifth chip 500. After the bonding processes, the plurality of peripheral upper bonding pads 343 may be bonded onto the fifth center bonding pad 541 and the fifth peripheral bonding pad 543, respectively and correspondingly. The fourth chip 400 may be bonded onto the fifth chip 500 with a procedure similar to the third chip 300, and descriptions thereof are not repeated herein.

Figure 22:
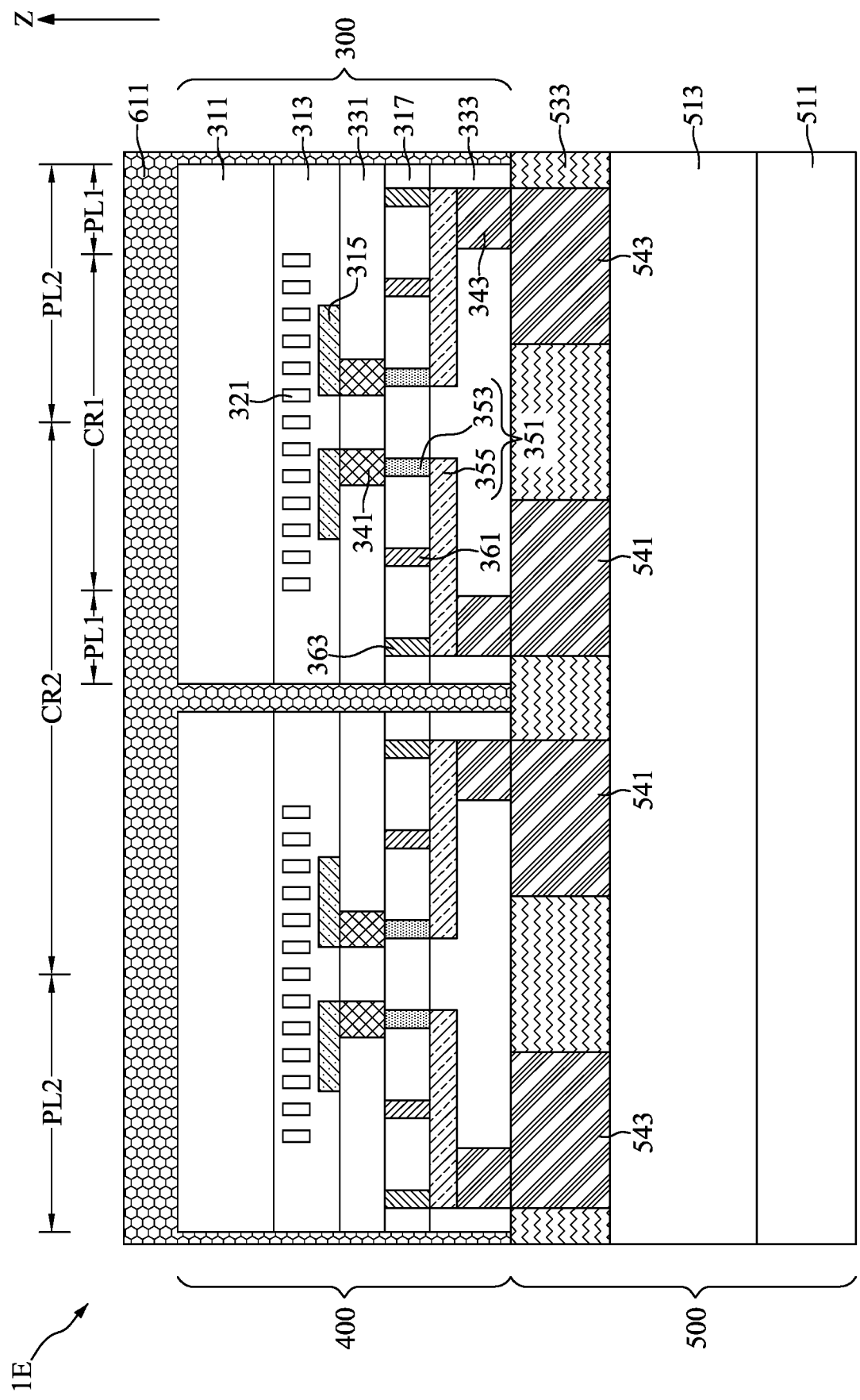

With reference to FIG. 22, a molding layer 611 may be formed on the fifth chip 500 to cover the third chip 300 and the fourth chip 400. In some embodiments, the molding layer 611 may be formed of a molding compound such as polybenzoxazole, polyimide, benzocyclobutene, epoxy laminate, or ammonium bifluoride. The molding layer 611 may be formed by compressive molding, transfer molding, liquid encapsulent molding, and the like. For example, a molding compound may be dispensed in liquid form. Subsequently, a curing process is performed to solidify the molding compound. The formation of molding compound may overflow the intermediate semiconductor device illustrated in FIG. 21 so that molding compound may completely cover the third chip 300 and the fourth chip 400. The third chip 300, the fourth chip 400, the fifth chip 500, and the molding layer 611 together configure the semiconductor device 1E.

One aspect of the present disclosure provides a semiconductor device including a first chip including: a first inter-dielectric layer positioned on a first substrate; a plug structure positioned in the first inter-dielectric layer and electrically coupled to a functional unit of the first chip; a first redistribution layer positioned on the first inter-dielectric layer and distant from the plug structure; a first lower bonding pad positioned on the first redistribution layer; and a second lower bonding pad positioned on the plug structure; and a second chip positioned on the first chip and including: a first upper bonding pad positioned on the first lower bonding pad; a second upper bonding pad positioned on the second lower bonding pad; and a plurality of storage units electrically coupled to the first upper bonding pad and the second upper bonding pad.

Another aspect of the present disclosure provides a semiconductor device including a fifth chip including: a fifth substrate including a center region and a peripheral region surrounding the center region; a fifth center bonding pad positioned above the center region of the fifth substrate; and a fifth peripheral bonding pad positioned above the peripheral region of the fifth substrate; and a third chip positioned on the fifth chip and including: a plurality of peripheral upper bonding pads located at a peripheral region of the third chip and respectively positioned on the fifth center bonding pad and the fifth peripheral bonding pad; a plurality of redistribution structures respectively positioned on the plurality of peripheral upper bonding pads and extending toward a center region of the third chip; a plurality of center lower bonding pads located at the center region of the third chip and respectively positioned on the plurality of redistribution structures; and a plurality of storage units electrically coupled to the plurality of center lower bonding pads.

Another aspect of the present disclosure provides a method for fabricating a semiconductor device including providing a first substrate including a functional unit; forming a plug structure on the first substrate and electrically coupled to the functional unit; forming a first redistribution layer above the first substrate; forming a first lower bonding pad on the first redistribution layer; forming a second lower bonding pad on the plug structure, wherein the first substrate, the plug structure, the first redistribution layer, the first lower bonding pad, and the second lower bonding pad together configure a first chip; and bonding a second chip onto the first chip. The second chip includes a first upper bonding pad bonded on the first lower bonding pad, a second upper bonding pad bonded on the second lower bonding pad, and a plurality of storage units electrically coupled to the first upper bonding pad and the second upper bonding pad.

Due to the design of the semiconductor device of the present disclosure, data signal may be transmitted through the first upper bonding pad 241, the first lower bonding pad 151, and the first redistribution layer 131 without passing through the conductive features, the plug structure 121, and functional units of the first chip 100. As a result, the distance of transmittance may be reduced so that the performance of the semiconductor device 1A may be improved. In addition, the power consumption of the semiconductor device 1A may be reduced due to the shorter distance of transmittance.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, and steps.

What is claimed is:

1. A method for fabricating a semiconductor device, comprising:
providing a first substrate comprising a functional unit;
forming a plug structure on the first substrate and electrically coupled to the functional unit;
forming a first redistribution layer above the first substrate;
extending a top surface of the plug structure through a bottom surface of the first redistribution layer;
forming a first lower bonding pad on the first redistribution layer;
forming a second lower bonding pad on the plug structure, wherein the first substrate, the plug structure, the first redistribution layer, the first lower bonding pad, and the second lower bonding pad together configure a first chip;
forming a third barrier layer between the plug structure and the second lower bonding pad;
forming a U-shaped protrusion at a bottom surface of the third barrier layer and extending the U-shaped protrusion of the third barrier layer through a top surface of the first redistribution layer in order to contact with the top surface of the plug structure, such that a contact between the plug structure and the third barrier layer is located between the top surface and the bottom surface of the first redistribution layer; and
bonding a second chip onto the first chip, wherein the second chip comprises a first upper bonding pad bonded on the first lower bonding pad, a second upper bonding pad bonded on the second lower bonding pad, and a plurality of storage units electrically coupled to the first upper bonding pad and the second upper bonding pad.

2. The method for fabricating the semiconductor device of claim 1, wherein the first chip is configured as a logic chip and the second chip is configured as a memory chip, and the plurality of storage units are configured as capacitor array or floating array.

3. The method for fabricating the semiconductor device of claim 1, wherein the plug structure comprises a bottom plug formed on the first substrate, a landing pad formed on the bottom plug, and a top plug formed on the landing pad, wherein the method further comprising extending a top surface of the top plug through the bottom surface of the first redistribution layer to contact with the U-shaped protrusion of the third barrier layer.

4. The method for fabricating the semiconductor device of claim 3, further comprising forming a first barrier layer between the top plug and the second lower bonding pad.

5. The method for fabricating the semiconductor device of claim 3, further comprising forming a second barrier layer between the landing pad and the top plug.

6. The method for fabricating the semiconductor device of claim 3, further comprising forming a fourth barrier layer between the first lower bonding pad and the first redistribution layer, and configuring the fourth barrier layer to have a U-shaped cross-sectional profile to receive the first lower bonding pad therewithin.

7. The method for fabricating the semiconductor device of claim 6, wherein a bottom surface of the U-shaped protrusion of the third barrier layer is at a vertical level lower than the top surface of the first redistribution layer.

8. The method for fabricating the semiconductor device of claim 3, wherein a width of the first chip and a width of the second chip are the same.

9. The method for fabricating the semiconductor device of claim 3, wherein the bottom plug comprises aluminum, copper, or a combination thereof, and the top plug comprises tungsten.

10. The method for fabricating the semiconductor device of claim 7, wherein the third barrier layer comprises titanium and titanium nitride.

11. The method for fabricating the semiconductor device of claim 10, wherein the plurality of storage units are configured as a capacitor array or a floating array.

12. The method for fabricating the semiconductor device of claim 1, wherein a width of the first upper bonding pad is larger than a width of the first lower bonding pad, wherein a width of the second upper bonding pad is larger than a width of the second lower bonding pad.

13. The method for fabricating the semiconductor device of claim 1, wherein the third barrier layer has the bottom surface in direct contact with the top surface of the first redistribution layer.

14. The method for fabricating the semiconductor device of claim 1, wherein the width of the second upper bonding pad is equal to a width of the third barrier layer.

15. The method for fabricating the semiconductor device of claim 6, wherein the width of the first upper bonding pad is equal to a width of the fourth barrier layer.

16. The method for fabricating the semiconductor device of claim 1, wherein the third barrier layer is disposed between the plug structure and the second lower bonding pad by the steps of:
forming a protrusion portion at a bottom of the second lower bonding pad toward the plug structure; and
forming the third barrier layer to have a U-shaped cross-sectional profile to receive the second lower bonding pad therewithin, wherein the protrusion portion of the second lower bonding pad is received in the U-shaped protrusion of the third barrier layer when the second lower bonding pad is received in the third barrier layer.

* * * * *